United States Patent [19]
Ohishi et al.

[11] Patent Number: 5,936,987
[45] Date of Patent: Aug. 10, 1999

[54] LASER BEAM EMITTING APPARATUS

[75] Inventors: Masahiro Ohishi; Fumio Ohtomo; Hiroshi Koizumi; Masayuki Momiuchi; Yoshiaki Goto, all of Tokyo, Japan

[73] Assignee: Kabushiki Kaisha TOPCON, Tokyo, Japan

[21] Appl. No.: 08/873,666

[22] Filed: Jun. 12, 1997

[30] Foreign Application Priority Data

Jun. 19, 1996 [JP] Japan .................................. 8-180016

[51] Int. Cl.[6] ..................................................... H01S 3/042
[52] U.S. Cl. ................................ 372/38; 372/22; 372/31; 372/34; 372/36
[58] Field of Search .................................. 372/38, 36, 31, 372/34, 22

[56] References Cited

U.S. PATENT DOCUMENTS 5,703,893  12/1997  Komiyama et al. ...................... 372/43

*Primary Examiner*—James W. Davie
*Attorney, Agent, or Firm*—Baker & Botts, L.L.P.

[57] ABSTRACT

The present invention relates to a laser beam emitting apparatus employing a semiconductor laser or the like and, more particularly, to a laser beam emitting apparatus capable of operating at low power consumption. A Peltier device driving unit of the present invention drives a Peltier device included in the laser beam emitting apparatus provided with an optical resonator having at least a laser crystal and an output mirror. A switching regulator generates a voltage corresponding to the duty factor of a pulse width modulator. An H-bridge changes the flowing direction of a current supplied to the Peltier device. The H-bridge comprises p-channel FETs, and n-channel FETS connected in parallel with the p-channel FETS.

5 Claims, 27 Drawing Sheets

$\tau_{FL} < T - \tau$ $\tau_{FL} > T - \tau$

LASER BEAM EMITTING APPARATUS

BACKGROUND OF THE INVENTION

The present invention relates to a laser beam emitting apparatus employing a semiconductor laser or the like and, more particularly, to a laser beam emitting apparatus capable of operating at low power consumption.

Laser beam emitting apparatuss employing a semiconductor laser have been used in various fields. Recent rapid progress of laser technology made possible the outdoor use of battery-powered laser beam emitting apparatuss as surveying instruments as well as laser beam emitting apparatuss using commercial power.

An example of a conventional laser beam emitting apparatus 10000 will be described with reference to FIG. 27. The laser beam emitting apparatus 10000 comprises a laser head 1000, a laser diode driving unit (LD driving unit) 2000, a Peltier device driving unit 3000, a nonlinear optical medium temperature detecting unit (KTP temperature detecting unit) 4000, and an analog controller 5000. The laser head 1000 includes a pumping laser diode 1100, a laser crystal ($YVO_4$) 1200, a nonlinear optical medium 1300, an output mirror (OC mirror) 1400, and a Peltier device 1500. The pumping laser diode 1100 is used for producing a laser beam and serves as a pumping source for generating a fundamental wave. The laser crystal 1200 is a medium having a negative temperature and amplifies light. The laser crystal 1200 employs $Nd:YVO_4$ having an oscillation line at 1064 nm. The laser crystal 1200 may be YAG (yttrium/aluminum/garnet) doped with $Nd^{3+}$ ions instead of $Nd:YVO_4$. YAG has oscillation lines at 946 nm, 1064 nm and 1319 nm. Ti:sapphire having an oscillation line at a wavelength in the range of 700 to 900 nm may be used.

A first dielectric reflecting film is formed for the pumping laser diode 1100 for pumping the laser crystal 1200. The first dielectric reflecting film has a high transmittance to laser radiation emitted by the pumping laser diode 1100, has a high reflectivity to the oscillation wavelength of the laser crystal 1200 and the second harmonic. The output mirror 1400 is disposed opposite to the laser crystal 1200 on which the first dielectric reflecting film is formed. The surface of the output mirror 1400 on the side of the laser crystal 1200 is formed in a concave spherical surface of an appropriate radius and a second dielectric reflecting film is formed on the concave spherical surface. The second dielectric reflecting film has a high reflectivity to the oscillation wavelength of the laser crystal 1200, and has a high transmittance to the second harmonic.

When the first dielectric reflecting film of the laser crystal 1200 and the output mirror 1400 are combined and the laser crystal 1200 is pumped by the light flux emitted by the pumping laser diode 1100, light reciprocates between the first dielectric reflecting film of the laser crystal 1200 and the output mirror 1400. Thus, light can be confined for a long time to amplify the light by resonance. In this conventional laser beam emitting apparatus 10000, the nonlinear optical medium 1300 is inserted in an optical resonator consisting of the first dielectric reflecting film of the laser crystal 1200, and the output mirror 1400.

Nonlinear optical effect will briefly be described. A body is polarized when an electric field is applied thereto. The intensity of polarization is proportional to the electric field if the intensity of the electric field is low. In the case of intense coherent light, such as a laser beam, the proportional relation between electric field and polarization is broken, and polarization components proportional to the square and the cube of the intensity of the electric field become dominant.

Therefore, in the nonlinear optical medium 1300, polarization caused by a light wave includes a polarization component proportional to the square and the cube of the intensity of a photoelectric field. Light waves of different frequencies are coupled by this nonlinear polarization, and the second harmonic of a frequency twice the frequency of light is generated. The generation of the second harmonic is called second harmonic generation (SHG).

Since the nonlinear optical medium 1300 is inserted in the optical resonator consisting of the laser crystal 1200 and the output mirror 1400, the higher harmonic generation in this laser beam emitting apparatus 10000 is called internal second harmonic generation (internal SHG). Since the conversion output is proportional to the square of the power of the fundamental wave, the light of a high intensity produced in the optical resonator can directly be used.

The nonlinear optical medium 1300 is, for example, KTP ($KTiOPO_4$, titanium potassium phosphate), BBO ($\beta\text{-}BaB_2O_4$, $\beta$ lithium borate) or LBO ($LiB_3O_5$, lithium triborate). Mainly, a wave of 1064 nm in wavelength is converted into a wave of 532 nm in wavelength. When the nonlinear optical medium 1300 is $KNbO_3$ (potassium niobate), a wave of 946 nm in wavelength is converted into a wave of 473 nm in wavelength.

In this laser beam emitting apparatus 10000, the laser diode driving unit (LD driving unit) 2000 drives the pumping laser diode 1100 by a constant DC current. The analog controller 5000 controls the Peltier device driving unit 3000 on the basis of a detection signal provided by the KTP temperature detecting unit 4000 so that the temperature of the nonlinear medium 1300 is equal to a predetermined temperature determined when the laser resonator was adjusted. The Peltier device driving unit 3000 drives the Peltier device 1500 to maintain the nonlinear optical medium 1300 at the predetermined temperature determined when the laser resonator was adjusted.

The analog controller 5000 carries out a simple analog control method.

As shown in FIG. 28, the laser diode driving unit 2000 comprises a transistor 2100, and a resistor 2200 connected to the base (B) of the transistor 2100. The transistor 2100 serves as a current amplifier. The collector current of the transistor 2100 is controlled by controlling an input voltage applied to the transistor 2100 by the analog controller 5000 to control the current supplied to the pumping laser diode 1100 from a power supply 6000.

As shown in FIG. 29, the Peltier device driving unit 3000 comprises an npn transistor 3100, a pnp transistor 3200 and a resistor 3300. The Peltier device driving unit 3000 is able to control the direction and the intensity of a current to be supplied to the Peltier device 1500 by using two power supplies 6100 and 6200, the npn transistor 3100 and the pnp transistor 3200.

This conventional laser beam emitting apparatus 10000 is capable of generating laser light of a wavelength different from that of the pumping laser light. However, the laser beam emitting apparatus 10000 consumes much power and hence, when incorporated into an instrument and powered by a battery, is able to operate only a relatively short time before the battery is exhausted. Accordingly, there has been an earnest desire for the development of a laser beam emitting apparatus capable of efficiently generating laser light at low power consumption and of continuously operating for a remarkably extended period of time.

In the conventional laser beam emitting apparatus 10000, the temperature of the laser is regulated at a temperature determined when the laser resonator was adjusted, and the Peltier device driving unit 3000 drives the Peltier device 1500 to adjust the temperature of the nonlinear optical medium to the temperature determined when the laser resonator was adjusted if the ambient temperature changes from that when the laser resonator was adjusted. The current flowing through the Peltier device 1500 increases as the difference between the ambient temperature and the temperature of the nonlinear optical medium when the laser resonator was adjusted becomes large. Therefore, the laser beam emitting apparatus 10000 has an inevitable disadvantage that it is difficult to use the laser beam emitting apparatus 10000 in a battery power supply mode in an environment requiring temperature control in a wide temperature range, such as an outdoor environment. In particular, it has been practically impossible to employ the conventional laser beam emitting apparatus 10000 in a portable instrument, such as a surveying instrument or a portable laser instrument.

The resonant state of the laser resonator changes with time and, in some cases, green laser light is generated efficiently at a temperature different from that determined during initial adjustment. The conventional laser beam emitting apparatus 10000 is unable to deal with such a condition and is unable to generate green laser light at a high efficiency.

Since the transistor 2100 of the laser driving unit (LD driving unit) 2000 operates in an unsaturated state while only a low operating current is necessary, the transistor 2100 wastes power $P=V_{CE} \times I_C$, where $V_{CE}$ is voltage across the collector (C) and the emitter (E) of the transistor 2100 and $I_C$ is collector current, and generates heat.

The Peltier device driving unit 3000, similarly to the laser diode driving unit 2000, operates the transistor 3100 or the transistor 3200 in an unsaturated state. Therefore, the transistor 3100 or the transistor 3200 wastes power $P=V_{CE} \times I_C$, where $V_{CE}$ is voltage across the collector (C) and the emitter (E) of the transistor 3100 or the transistor 3200, and $I_C$ is collector current, and generates heat.

Furthermore, the Peltier device driving unit 3000 needs the two power supplies 6100 and 6200 respectively for cooling and heating, which increases the number of parts and the costs, and makes the miniaturization of the laser beam emitting apparatus 10000 difficult.

SUMMARY OF THE INVENTION

According to the present invention, a laser beam emitting apparatus comprises a laser provided with an optical resonator having a laser crystal and an output mirror, a Peltier device combined with the laser, a Peltier device driving unit for driving the Peltier device, a pulse width modulator (PWM), a switching regulator for generating a voltage corresponding to the duty factor of the pulse width modulator (PWM), a current detecting unit for detecting the current flowing through the Peltier device, and an H-bridge unit consisting of p-channel FETs and n-channel FETs connected to the Peltier device in parallel with the p-channel FETs.

BRIEF DESCRIPTION OF THE DRAWINGS

FIG. 18(*b*) is a graph of assistance in explaining gain switching, showing the variation of the intensity of light with time;

FIG. 18(*c*) is a graph of assistance in explaining gain switching, showing the variation of population inversion with time;

FIG. 20(*b*) is graphs showing a condition when the period T of pulse driving power supplied to the pumping laser diode meets a condition expressed by $\tau_{FL} > T-\tau$;

FIG. 21(*b*) is a graph showing the relation between the output of a fundamental wave in an optical resonator and the output of the pumping laser diode;

FIG. 21(*c*) is a graph showing the relation between the output of a fundamental wave in the optical resonator and the output of a second harmonic wave when a nonlinear optical medium is inserted in the optical resonator;

DESCRIPTION OF THE PREFERRED EMBODIMENTS

Figure 1:
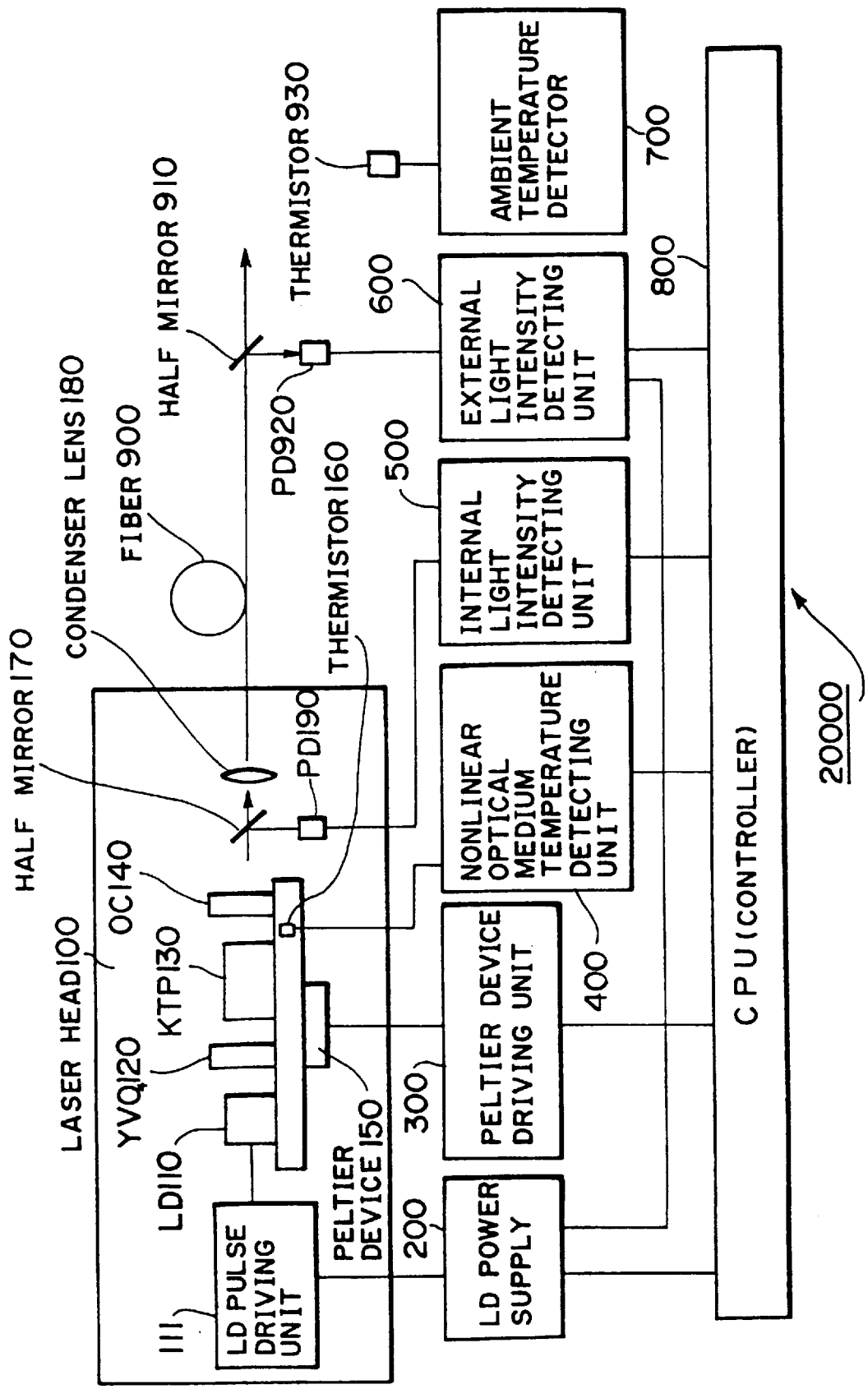
FIG. 1 is a block diagram of a laser beam emitting apparatus in a preferred embodiment according to the present invention.

Referring to FIG. 1 showing a laser beam emitting apparatus 20000 in a preferred embodiment according to the present invention, the laser beam emitting apparatus 20000 comprises a laser head 100, a laser diode power supply (LD power supply) 200, a Peltier device driving unit 300, a nonlinear optical medium temperature detecting unit 400, an internal light intensity detecting unit 500, an external light intensity detecting unit 600, an ambient temperature detector 700 and a controller 800.

The laser head 100 comprises a pumping laser diode (LD) 110, a laser diode pulse driving unit (LD pulse driving unit) 111, a laser crystal 120, such as $YVO_4$, a nonlinear optical medium (KTP) 130, an output mirror (OC) 140, a Peltier device 150, a first thermistor 160, a first half mirror 170, a condenser lens 180, and a first photodiode (PD) 190. The LD pulse driving unit 111 is incorporated into the laser head 100.

The LD pulse driving unit 111 drives the pumping laser diode 110 for pulse light emission to pump the laser crystal 120. The laser crystal 120 and the output mirror 140 constitute an optical resonator. Light is reciprocated between the laser crystal 120 and the output mirror 140 to emit a laser beam. A nonlinear optical medium 130 is inserted between the laser crystal 120 and the output mirror 140 to generate a second harmonic wave so that a green laser beam is emitted. The green laser beam is split by a first half mirror 170. Part of the green laser beam transmitted through the first half mirror 170 is condensed by a condenser lens 180 on an external fiber 900. The constitution and functions of the laser head 100 excluding the first photodiode 190 are the same as those of the laser head 1000 of the foregoing conventional laser beam emitting apparatus 10000, and hence the description thereof will be omitted. The LD power supply 200 supplies power to the LD pulse driving unit 111 included in the laser head 100. A Peltier device driving unit 300 drives the Peltier device 150 included in the laser head 100. The nonlinear optical medium temperature detecting unit 400 detects the temperature of the nonlinear optical medium 130 from a detection signal provided by the first thermistor 160 included in the laser head 100. The internal light intensity detecting unit 500 of the laser head 100 detects the intensity of the green laser beam generated in the laser head from a detection signal provided by the first photodiode 190 which receives the green laser beam reflected by the first half mirror 170 included in the laser head 100. The internal light intensity detecting unit 500 amplifies a detection signal provided by the first photodiode 190, converts the amplified detection signal into a corresponding digital signal by A/D conversion, and gives the digital signal to the controller 800. The controller 800 examines the digital signal to monitor the laser beam generating condition of the laser head 100. The first photodiode 190 is an internal light intensity detecting means.

The external light intensity detecting unit 600 detects the intensity of the green laser beam at the outlet end of the fiber 900 led outside from the laser head 100 on the basis of a detection signal provided by a second photodiode 920 which receives the green laser beam projected on and reflected by a second half mirror 910. The external light intensity detecting unit 600 amplifies a detection signal provided by the second photodiode 920, converts the amplified detection signal into a corresponding digital signal by A/D conversion and gives the digital signal to the controller 800. The controller 800 monitors the output of the laser beam emitting apparatus 20000. The second photodiode 920 is a light intensity detecting means. Part of the green laser beam transmitted through the second half mirror 910 is projected outside from the laser beam emitting apparatus 20000.

The ambient temperature detector 700 detects the ambient temperature from a temperature signal provided by a second thermistor 930 for measuring the ambient temperature. The ambient temperature detector 700 amplifies a temperature signal provided by the second thermistor 930, converts the amplified temperature signal into a corresponding digital temperature signal by A/D conversion, and gives the digital temperature signal to the controller 800.

The controller 800 is a data processing means including a CPU. The controller 800 controls the LD pulse driving unit 111 through the LD power supply 200 on the basis of detected data given thereto from the external light intensity detecting unit 600 to control the current supplied to the pumping laser diode 110 so that the intensity of the green laser beam is kept constant. The controller 800 controls the Peltier device driving unit 300 on the basis of detection data given thereto from the nonlinear optical medium temperature detecting unit 400 to regulate the temperature of the nonlinear optical medium 130 by controlling the current supplied to the Peltier device 150. Thus, it is possible to prevent the variation of the intensity of the output laser beam attributable to the variation of the refractive index of the nonlinear optical medium 130 caused by the variation of the temperature of the nonlinear optical medium 130. The controller 800 carries out a feedback control operation on the basis of detection data provided by the ambient temperature detector 700 so that a green laser beam of a predetermined intensity can be emitted at temperatures around the ambient temperature, and controls the temperature of the nonlinear optical medium 130 so that the total power consumption is reduced to the least possible extent. The controller 800 carries out various control operations and controls the general operations of the laser beam emitting apparatus 20000.

The laser beam emitting apparatus 20000 detects the intensity of the green laser beam at an exit end of the fiber 900 and carries out a feedback control operation to regulate the intensity of the green laser beam so that the green laser beam of a desired intensity is emitted from the fiber 900. Therefore, the intensity of the green laser beam at the exit end of the fiber 900 increases if a trouble, such as the malfunction of the second photodiode 920 or the disconnection of an associated cable, occurs. In such a case, safety standards require stopping the emission of the green laser beam. However, it is impossible to decide whether the laser head 100 failed or whether the second photodiode 920 failed if only the second photodiode 920 is used for detecting the green laser beam. Since the first photodiode 190 is connected to the internal light intensity detecting unit 500 in this embodiment, light emitting condition in the laser head 100 can be monitored and the failure of the second photodiode 920 can be detected. The emission of the green laser beam is stopped to improve safety when the first photodiode 190 provides an output and the second photodiode 920 does not provide any output.

Figure 2:
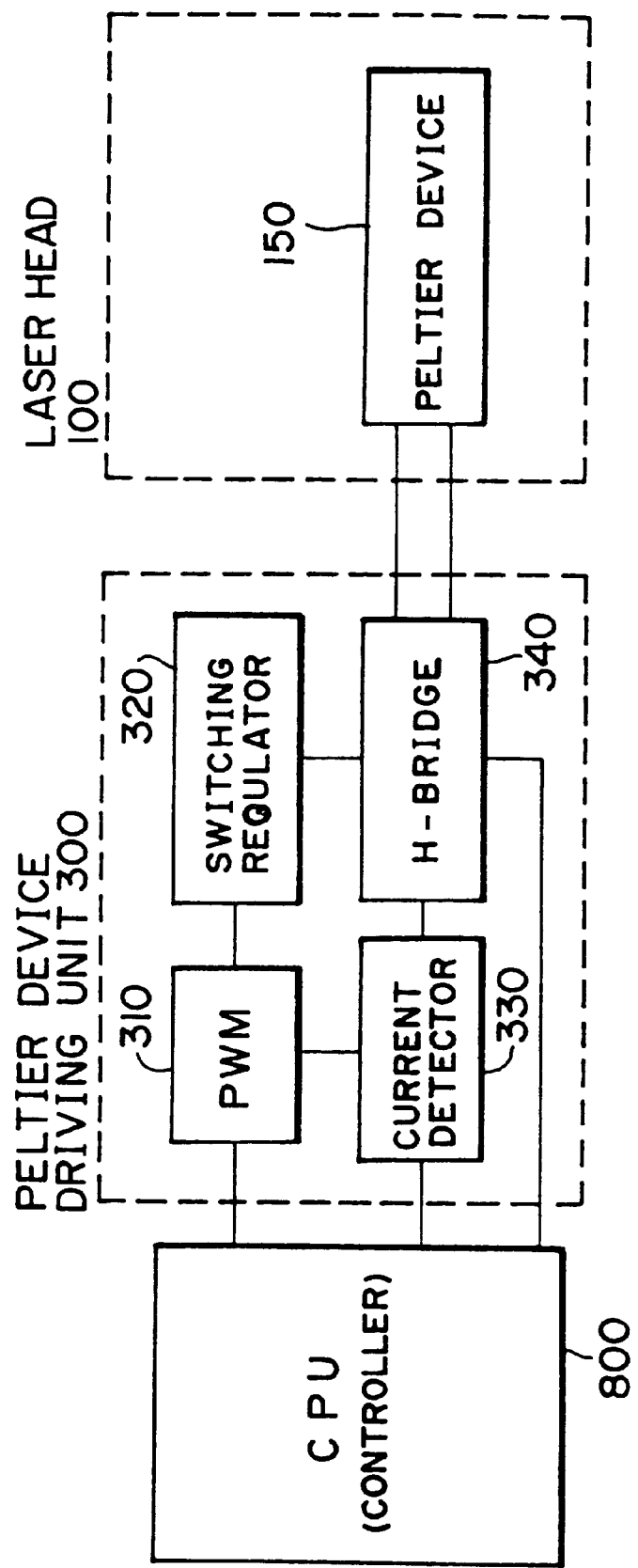
FIG. 2 is a block diagram of a Peltier device driving unit included in the laser beam emitting apparatus of FIG. 1.

The Peltier device driving unit 300 will be described with reference to FIG. 2. The Peltier device driving unit 300 comprises a pulse width modulator (PWM) 310, a switching regulator 320, a current detector 330 and an H-bridge 340. The PWM 310 generates a pulse signal of a duty factor in the range of 0 to 100% and gives the same to the switching regulator 320.

Figure 3:
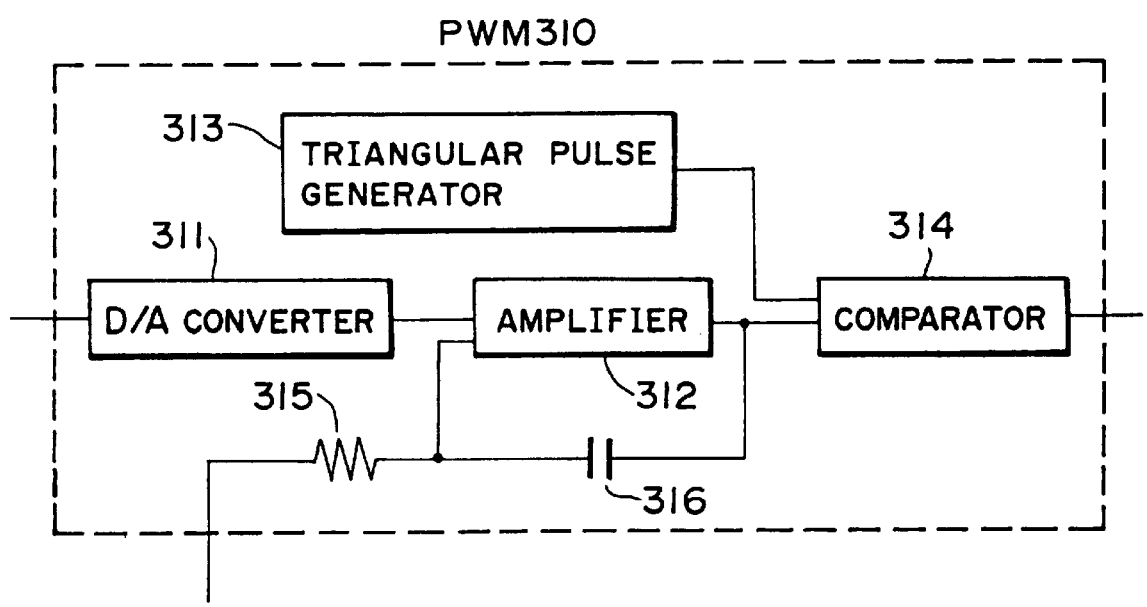
FIG. 3 is a block diagram of a pulse width modulator (PWM) included in the Peltier device driving unit of FIG. 2.

Referring to FIG. 3, the PWM 310 comprises a D/A converter 311, an amplifier 312, a triangular pulse generator 313, a comparator 314, a resistor 315 and a capacitor 316. A control signal received from the controller 800 is converted into a control voltage by D/A conversion by the D/A converter 311. The control voltage, and a current detected by the current detector 330 are given to an integrating circuit comprising the amplifier 312, the resistor 315 and the capacitor 316. The integrating circuit integrates the difference between the output voltage of the D/A converter 311, and a voltage obtained by converting the current detected by the current detector 330. The output voltage of the integrating circuit is compared with a triangular pulse signal generated by the triangular pulse generator 313 by the comparator 314, and the comparator 314 gives a pulse width modulating signal to the switching regulator 320.

If the output voltage of the current detector 330 is lower than the output voltage of the D/A converter 311, the output of the integrating circuit increases, the duty factor of the output of the comparator 314 increases, the output voltage of the switching regulator 320 increases and, consequently, the current supplied to the Peltier device 150 is increased. The output voltage of the integrating circuit increases until the output voltage of the D/A converter 311 coincides with the output voltage of the current detector 330.

Figure 4:
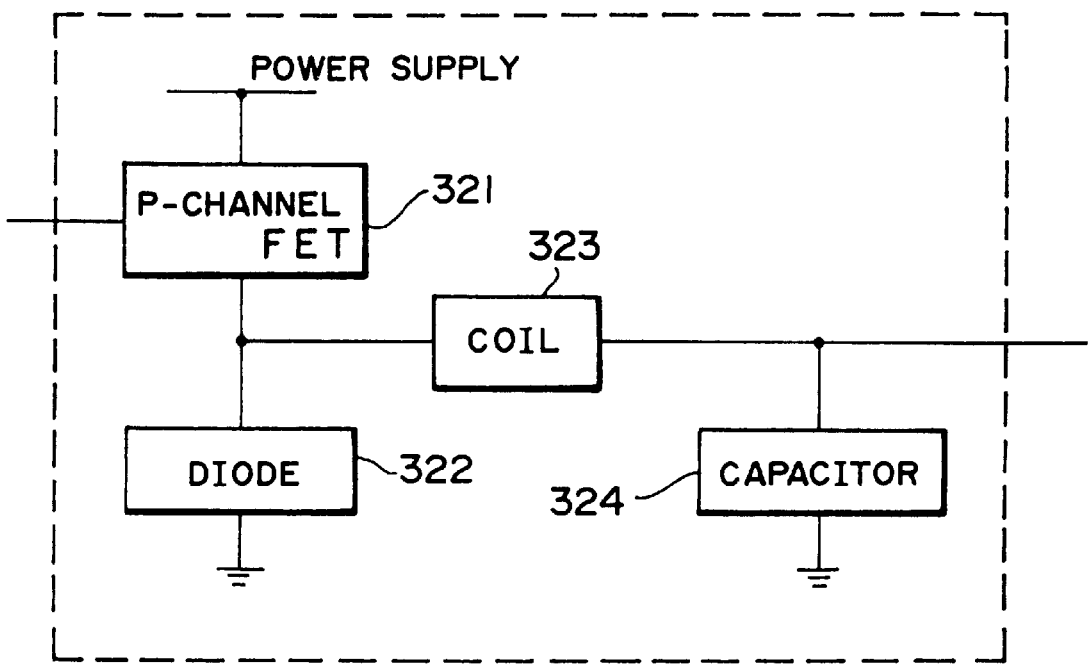
FIG. 4 is a block diagram of a switching regulating unit included in the Peltier device driving unit of FIG. 2.

Referring to FIG. 4, the switching regulator 320 comprises a p-channel FET 321, a diode 322, a coil 323 and a capacitor 324. The output voltage of the switching regulator 320 corresponds to the duty factor of the pulse signal provided by the PWM 310. The output of the PWM 310 is applied to the gate terminal of the p-channel FET to turn on the p-channel FET 321. A current supplied from the power supply flows through the p-channel FET 321 and the coil 323 to charge the capacitor 324. Energy stored in the coil 323 flows through the diode 322 and is stored in the coil 323. Voltage across the coil can be controlled by the duty factor of the pulse signal provided by the PWM 310. Energy of the voltage across the coil 323 serves as a secondary power supply for driving the Peltier device 150. The output voltage of the switching regulator 320 is applied to the Peltier device 150 through the H-bridge 340 capable of changing the direction of the current supplied to the Peltier device 150. The current supplied to the Peltier device 150 is detected by the current detector 330 and the output of the current detector 330 is given as a feedback signal to the PWM 310. The output of the current detector 330 is given also to the controller 800 after A/D conversion. The PWM 310, the switching regulator 320, the current detector 330 and the H-bridge 340 constitute a negative feedback loop for the current supplied to the Peltier device 150, and the controller 800 controls the current. Any suitable switch may be used instead of the switching element, such as an ordinary transistor.

The H-bridge 340 changes the direction of the current supplied to the Peltier device 150 according to a control signal given thereto by the controller 800. The nonlinear optical medium 130 can be heated and cooled by a single power supply.

Figure 6:
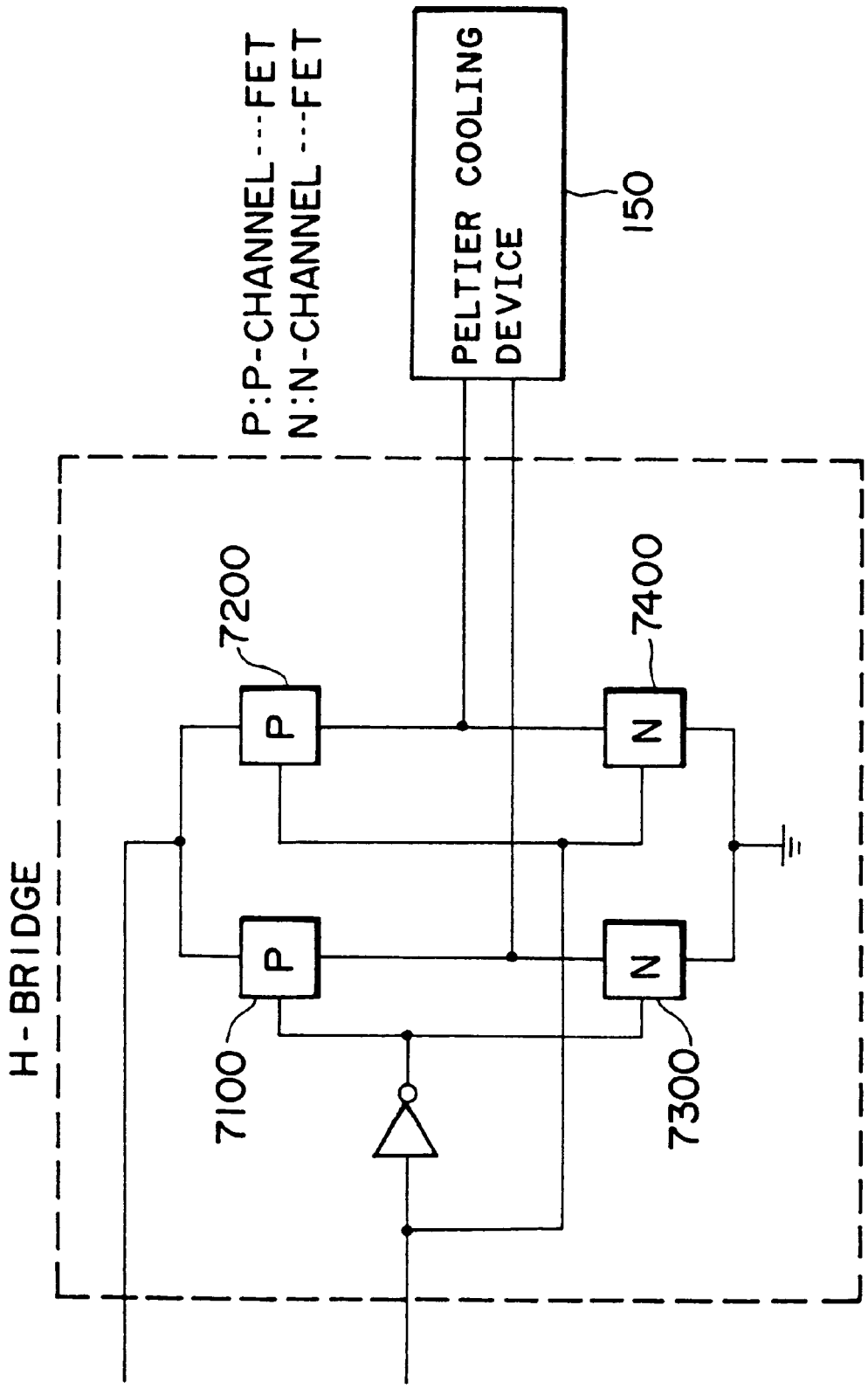
FIG. 6 is a block diagram of a conventional H-bridge.

A conventional H-bridge will be described with reference to FIG. 6. A conventional H-bridge comprises a first p-channel FET 7100, a second p-channel FET 7200, a first n-channel FET 7300 and a second n-channel FET 7400. The FETs on one diagonal line go ON when the control voltage is HIGH, and the FETs on the other diagonal line go ON when the control voltage is LOW to supply a current to the Peltier device 150. However, a power supply for the H-bridge needs to apply a voltage necessary to obtain a gate-source voltage high enough to turn on the p-channel FET to the H-bridge when the control voltage is LOW to make the H-bridge operate efficiently. If the supply voltage applied to the H-bridge is low, the gate-source voltage of the p-channel FET is low, and the p-channel FET is unable to go ON and exerts a high on-state resistance. Consequently, the p-channel FET generates heat and reduces the efficiency of the H-bridge.

Figure 5:
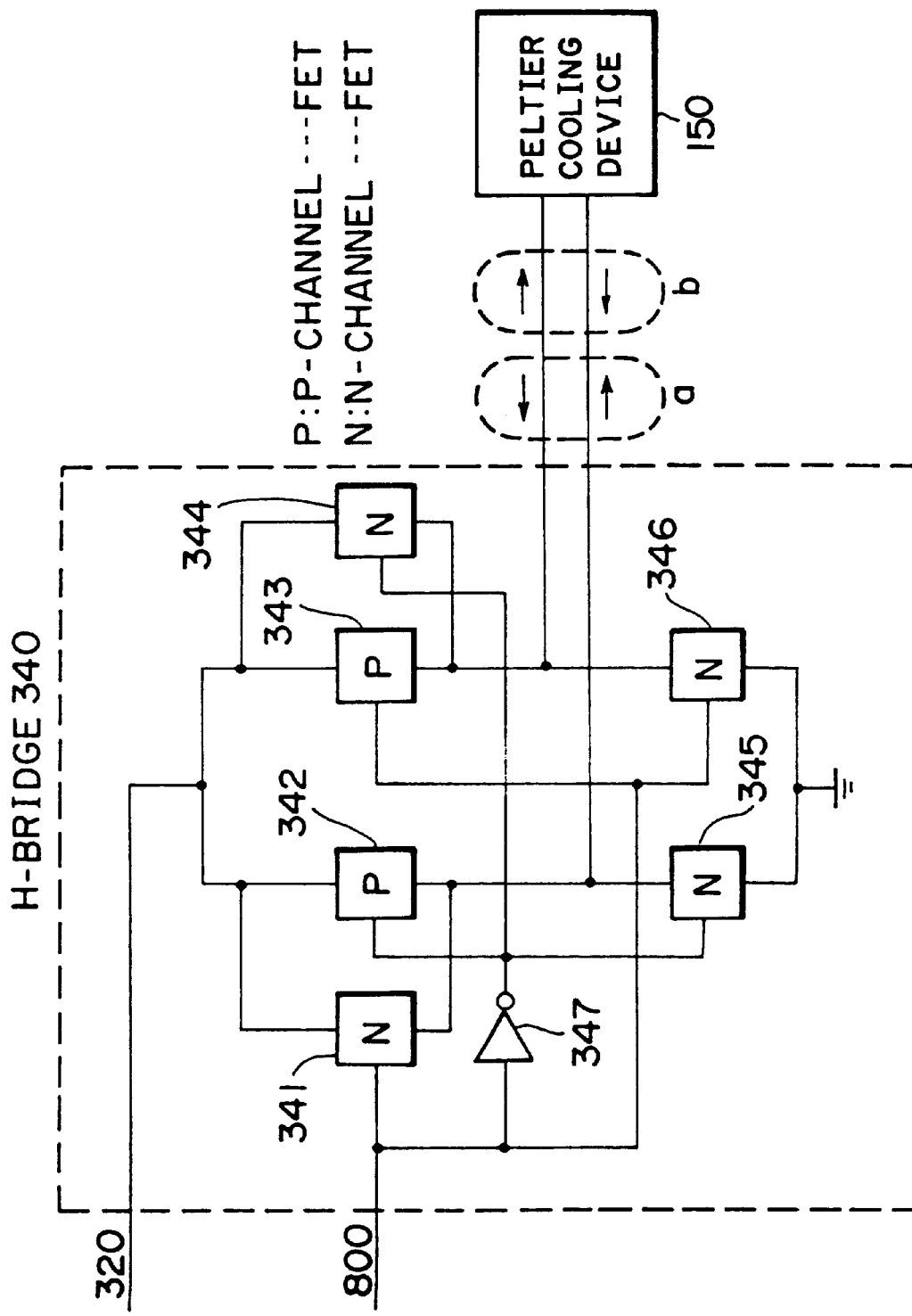
FIG. 5 is a block diagram of an H-bridge included in the Peltier device driving unit of FIG. 2.

Referring to FIG. 5 showing the H-bridge 340 of the present invention, the H-bridge 340 comprises a first n-channel FET 341, a first p-channel FET 342, a second p-channel FET 343, a second n-channel FET 344, a third n-channel FET 345, a fourth n-channel FET 346 and an inverter 347. When the control signal provided by the controller 800 is HIGH, the first n-channel FET 341, the first p-channel FET 342 and the fourth n-channel FET 346 are ON, so that the current supplied to the Peltier device 150 flows in the direction of the arrows a for a cooling operation. When the control signal provided by the controller 800 is LOW, the second p-channel FET 343, the second n-channel FET 344 and the third n-channel FET 345 are ON, so that the current supplied to the Peltier device 150 flows in the direction of the arrows b for a heating operation.

A low supply voltage is applied to the H-bridge 340 and the on-resistance of the p-channel FET increases if a small current is supplied to the Peltier device 150. However, the n-channel FET paralleled with the p-channel FET goes ON, whereby the parallel resistance can be reduced. The current flowing through the Peltier device 150 flows through the n-channel FET and the p-channel FET does not generate heat.

The voltage across the Peltier device 150 is high and, in some cases, the on-resistance of the n-channel FET paralleled with the p-channel FET increases and the n-channel FET cannot go ON if a large current flows through the Peltier device 150. In such a case, a high supply voltage is applied to the H-bridge 340, the on-resistance of the p-channel FET is low, the p-channel FET goes ON and the p-channel FET does not generate heat.

Switching devices, such as ordinary transistors may be used instead of the FETS.

The H-bridge 340 thus constructed according to the present invention operates efficiently regardless of the magnitude of the input voltage. The control elements of the Peltier driving unit 300 generate heat scarcely and Peltier driving unit 300 does not waste power for heat generation because the switching regulator 320 and the H-bridge 340 use a saturation region or a cutoff region. Accordingly, the power of the power supply can efficiently be supplied to the Peltier device 150 and the laser beam emitting apparatus operates at a low power consumption.

A switching regulator of a step-up type may be used instead of the switching regulator 320 of a step-down type employed in this embodiment.

Figure 7:
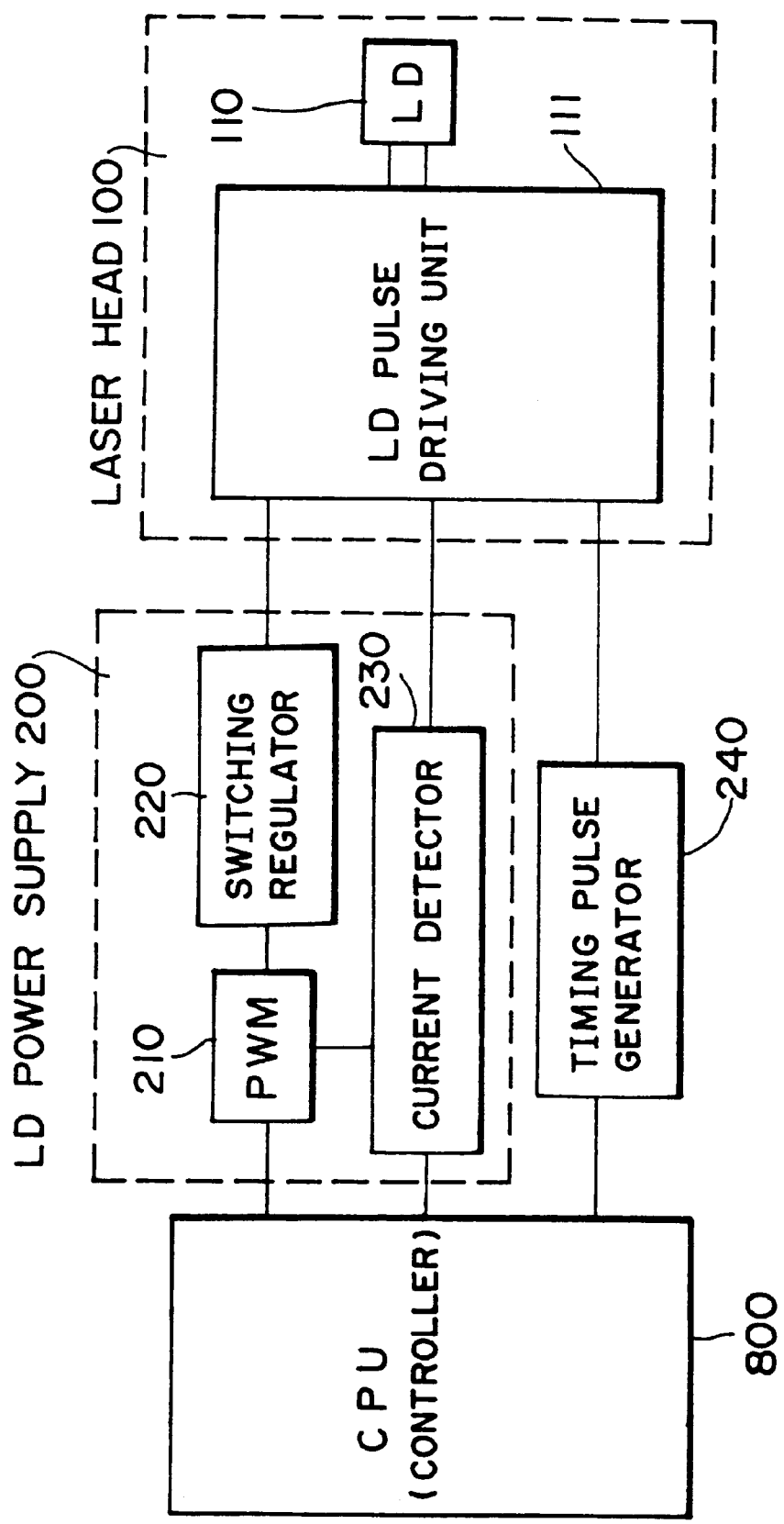
FIG. 7 is a block diagram of a laser diode power supply (LD power supply)

The LD power supply 200 will be described with reference to FIG. 7. The LD power supply 200 and the LD pulse driving unit 111 correspond to a laser diode driving means.

The LD power supply 200 comprises a PWM 210, a switching regulator 220 and a current detector 230. The PWM 210 generates a pulse signal of a duty factor in the range of 0 to 100% on the basis of signals provided by the controller 800 and the current detector 230, and gives the pulse signal to the switching regulator 220.

Figure 8:
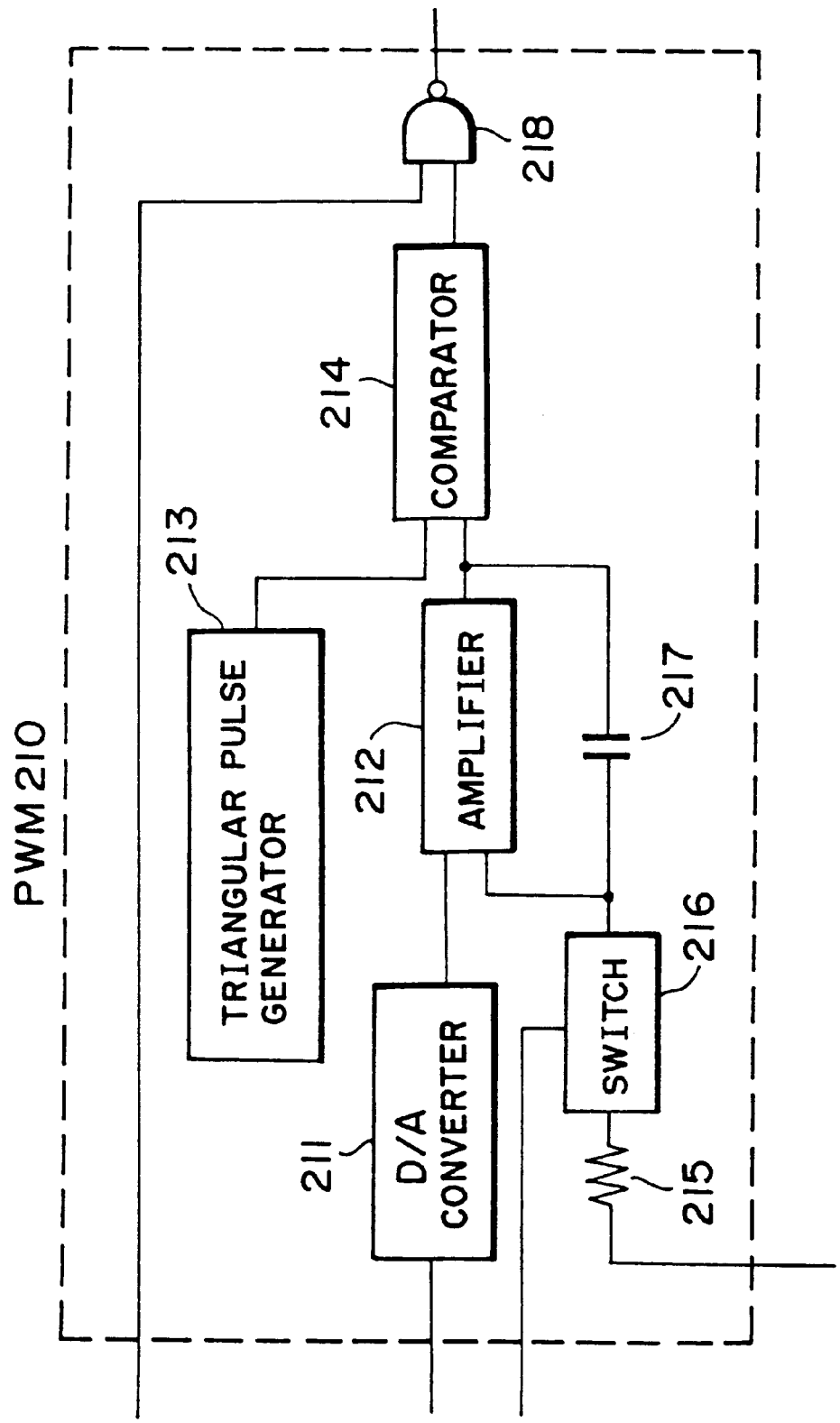
FIG. 8 is a block diagram of a pulse width modulator (PWM) included in the laser diode power supply of FIG. 7.

Referring to FIG. 8, the PWM 210 comprises a D/A converter 211, an amplifier 212, a triangular pulse generator 213, a comparator 214, a resistor 215, analog switch 216, a capacitor 217 and a logic circuit 218.

The D/A converter 211 converts a control signal provided by the controller 800 into a corresponding control voltage by D/A conversion. The control voltage and a current detected by the current detector 230 are applied to an integrating circuit consisting of the amplifier 212, the resistor 315 and the capacitor 317. The integrating circuit integrates the difference between the output voltage of the D/A converter 211, i.e., the control voltage, and a voltage obtained by converting the current detected by the current detector 230. The comparator 214 compares the output voltage of the integrating circuit with a triangular pulse signal generated by the triangular pulse generator 213, and a pulse width modulating signal is given to the switching regulator 220.

If the output voltage of the current detector 230 is lower than the output voltage of the D/A converter 211, the output of the integrating circuit increases, the duty factor of the output of the comparator 214 increases, the output voltage of the switching regulator 220 increases and the current supplied to the pumping laser diode 110 increases. The output voltage of the integrating circuit increases until the output voltage of the D/A converter 211 and the output voltage of the current detector 230 coincide with each other.

The analog switch 216 and the logic circuit 218 are controlled by the controller 800 to hold a circuit for flickering the green laser beam.

Figure 9:
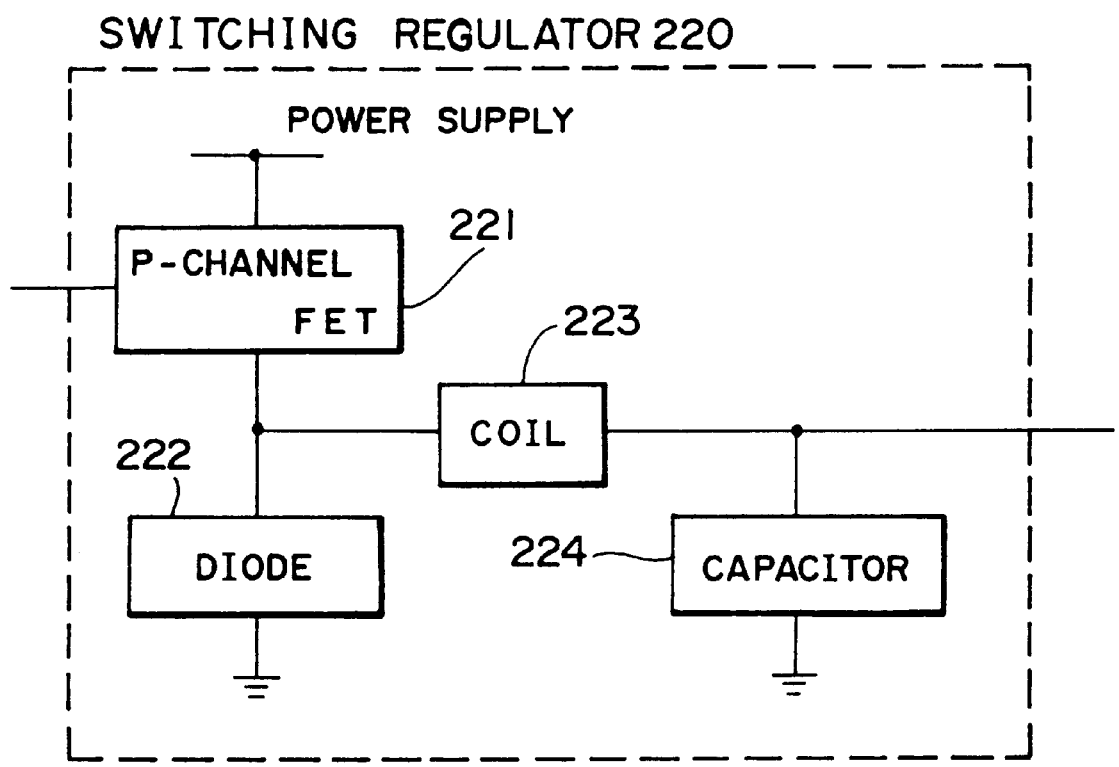
FIG. 9 is block diagram of a switching regulator included in the laser diode power supply of FIG. 7.

Referring to FIG. 9, the switching regulator 220 comprises a p-channel FET 221, a diode 222, a coil 223 and a capacitor 224. The switching regulator 220 generates a voltage corresponding to the duty factor of the pulse signal provided by the PWM 210. The configuration and the functions of the switching regulator 220 are the same as those of the switching regulator 320 of the Peltier device driving unit 300 and hence the description thereof will be omitted.

The output voltage of the switching regulator 220 is given to the LD pulse driving unit 111 included in the laser head 100. The LD pulse driving unit 111 drives the pumping laser diode 110 intermittently according to a LD pulse drive timing signal provided by the timing pulse generator 240.

The current detector 230 detects the current flowing through the pumping laser diode 110 and gives its output signal to the PWM 210 for feedback control. The output of the current detector 230 is given also to the controller 800. The PWM 210, the switching regulator 220, the current detector 230 and the pumping laser diode 110 constitute a negative feedback loop for a constant current loop, and the controller 800 controls the current.

Figure 10:
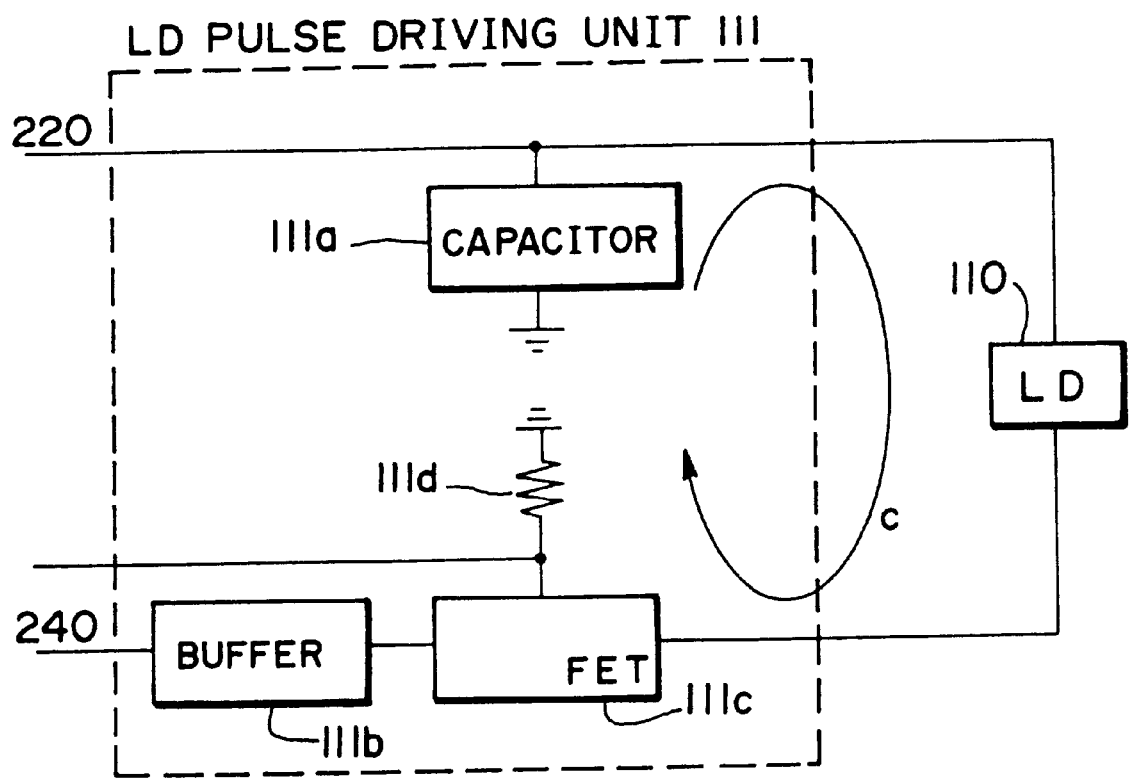
FIG. 10 is a block diagram of a laser diode pulse driving unit.

Referring to FIG. 10, the LD pulse driving unit 111 comprises a capacitor 111a, a buffer 111b, a FET 111c and a resistor 111d. The pulse driving unit 111 may employ any suitable switching element instead of the FET 111c. The switching regulator 220 applies a voltage to the capacitor 111a to charge the same. The capacitor 111a serves as a secondary power supply for supplying a pulse current to the pumping laser diode 110. A timing pulse signal generated by the timing pulse generator 240 is transmitted through the buffer 111b to the gate terminal of the FET 111c to supply a pulse current to the pumping laser diode 110. Since the LD pulse driving unit 111 is included in the laser head 100, the length of wiring lines of a circuit in which the pulse current flows through the capacitor 111a, the buffer 111b, the FET 111c and the resistor 111d is relatively short and hence the high-speed pulse modulation of the pumping laser diode 110 is possible, and the effect of the laser head 100 on noise generation in the external devices can be suppressed.

In the LD power supply 200 thus constructed, the control elements generate heat scarcely and the LD power supply does not waste power for heat generation because the current control circuit, such as the switching regulator 220, uses a saturation region or a cutoff region. Accordingly, the power of the power supply can efficiently be used for driving the pumping laser diode 110 and hence the laser beam emitting apparatus is able to operate at a low power consumption.

A switching regulator of a step-up type may be used instead of the switching regulator 220 of a step-down type employed in this embodiment. The configuration and the functions of the LD power supply 200 and such are the same as those of the corresponding portions of the Peltier device driving unit 300 and hence the description thereof will be omitted.

Figure 11:
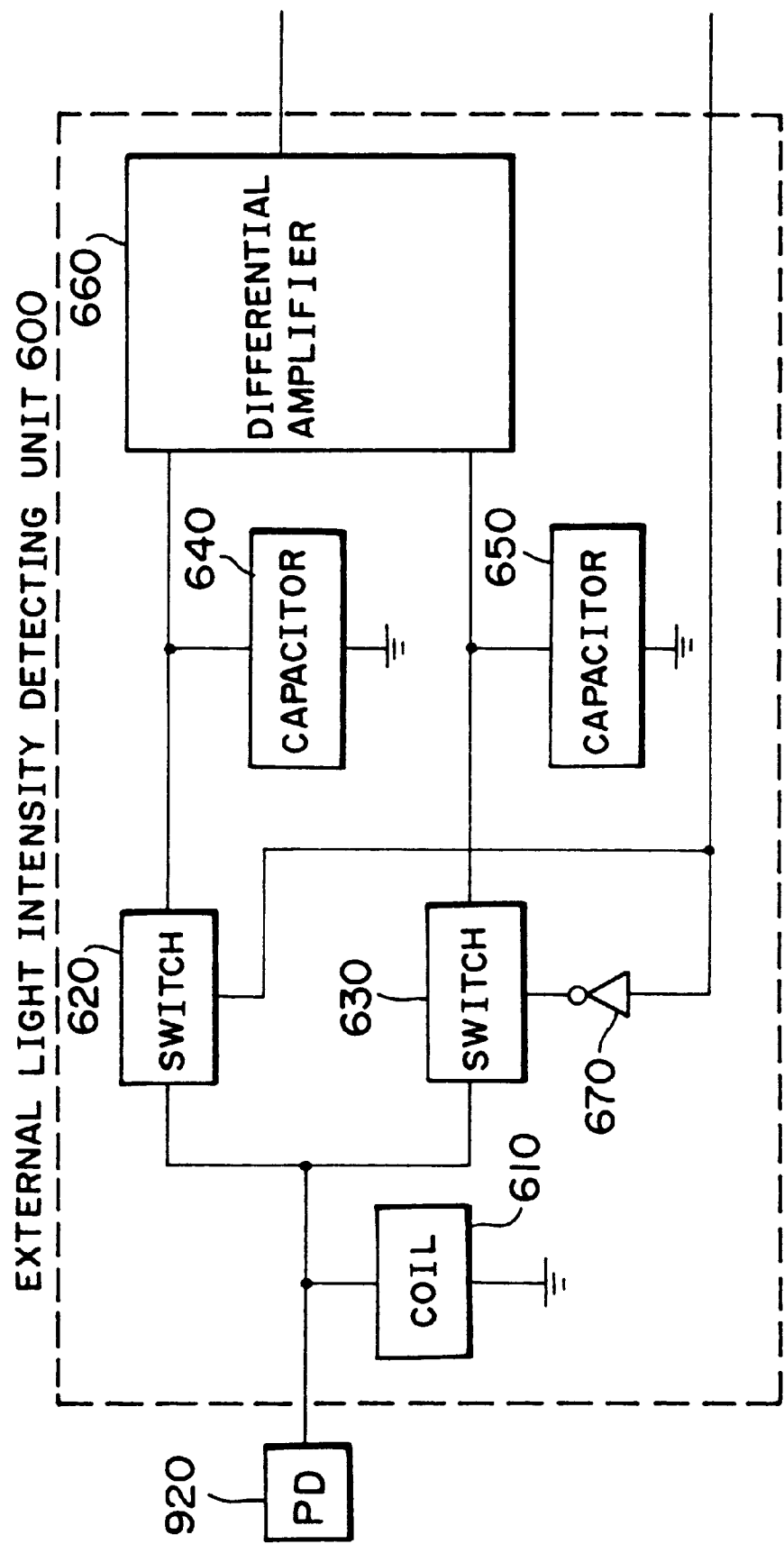
FIG. 11 is a block diagram of an external light intensity detecting unit.
Figure 12:
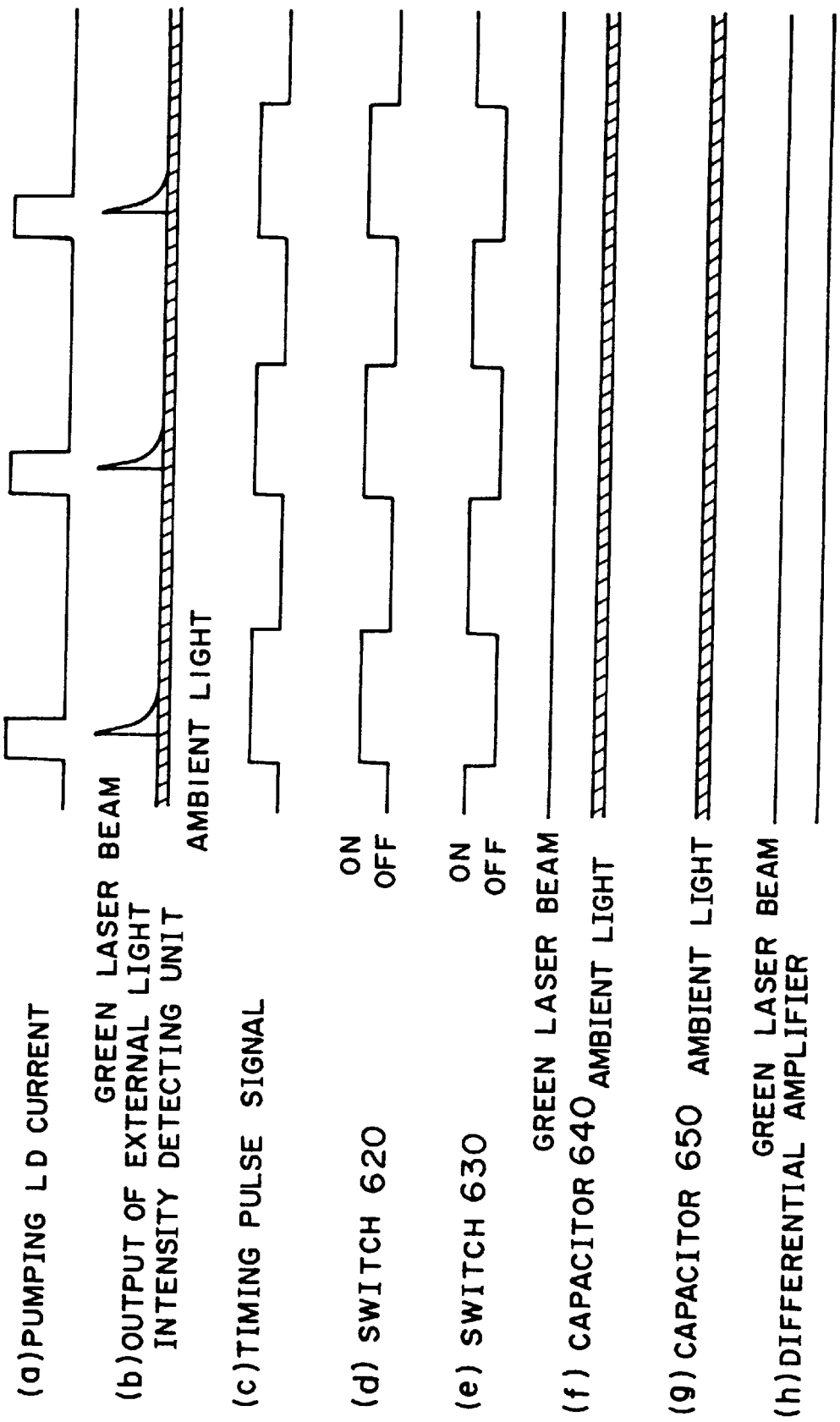
FIG. 12 is a diagrammatic views of assistance in explaining the operation of the external light intensity detecting unit.

The external light intensity detecting unit 600 will be described with reference to FIGS. 11 and 12. Referring to FIG. 11, the external light intensity detecting unit 600 comprises a coil 610, a first analog switch 620, a second analog switch 630, a first capacitor 640, a second capacitor 650, a differential amplifier 660, and an inverter 670. When the pumping laser diode 110 is driven, the optical resonator emits pulse green laser beam through the exit end of the fiber 900. Part of the pulse green laser beam is reflected by the second half mirror 910 toward the second photodiode 920. Since the second photodiode 920 is disposed near the output end of the laser beam emitting apparatus 20000, the second photodiode 920 receives external light, such as sunlight, as well as the pulse green laser beam. The output current of the second photodiode 920 flows through the coil 610. Since the impedance of the coil 610 to a fluctuating current produced by the second photodiode 920 corresponding to the pulse green laser light is high, the pulse green laser beam produces a high voltage across the coil 610. Since the impedance of the coil 610 to a constant current produced by the second photodiode 920 corresponding to constant external light, such as the sunlight, constant external light produces a low voltage across the coil 610. Therefore, the influence of external light can be eliminated by connecting the coil 610 as a load to the second photodiode 920.

When the timing pulse generator 240 of the LD power supply 200 generates a pumping pulse signal as shown in FIG. 12(c), pulse signals of 50% in duty factor as shown in FIGS. 12(d) and 12(e) synchronous with the pumping pulse signal are supplied to the first analog switch 620 and the second analog switch 630, respectively. Consequently, the first analog switch 620 and the second analog switch 630 are turned on and off alternately in synchronism with the pulse green laser beam. The first analog switch 620 goes ON when the pulse green laser beam is ON, while the second analog switch 630 goes ON when the pulse green laser beam is OFF. Therefore, the first capacitor 640 connected to the first analog switch 620 is charged by the current produced by the second photodiode 920 as shown in FIG. 12(f) upon the reception of the pulse green laser beam, while the second capacitor 650 connected to the second analog switch 630 is charged by the current produced by the second photodiode 920 as shown in FIG. 12(g) produced by the second photodiode 920 upon the reception of external light. Since the first analog switch 620 and the second analog switch 630 are turned on and off alternately by the pulse signal of 50% in duty factor, and the intensity of the external light is constant, the effect of the external light can be eliminated and only the pulse green laser beam can be amplified and extracted as shown in FIG. 12(h) by amplifying the signals transmitted through the switches 620 and 630 to the differential amplifier 660 by the differential amplifier 660. The output signal of the differential amplifier 660 is sent to the controller 800, and the controller 800 controls the LD pulse driving unit 111 so that the output signal of the differential amplifier 660 is kept constant.

The external light intensity detecting unit 600 thus constructed measures the intensity of the output green laser beam at the exit end of the fiber 900, and the controller 800 controls the LD pulse driving unit 111 on the basis of the measured intensity of the output green laser beam, the green laser beam can stably emitted without being affected by external light, such as sunlight.

A temperature control method to be carried out by this embodiment will be described hereinafter. The refractive index of the nonlinear optical medium 130 included in the laser resonator varies with temperature. If the refractive index of the nonlinear optical medium varies, the intensity of the output laser beam of the laser beam emitting apparatus 20000 varies accordingly.

Figure 13:
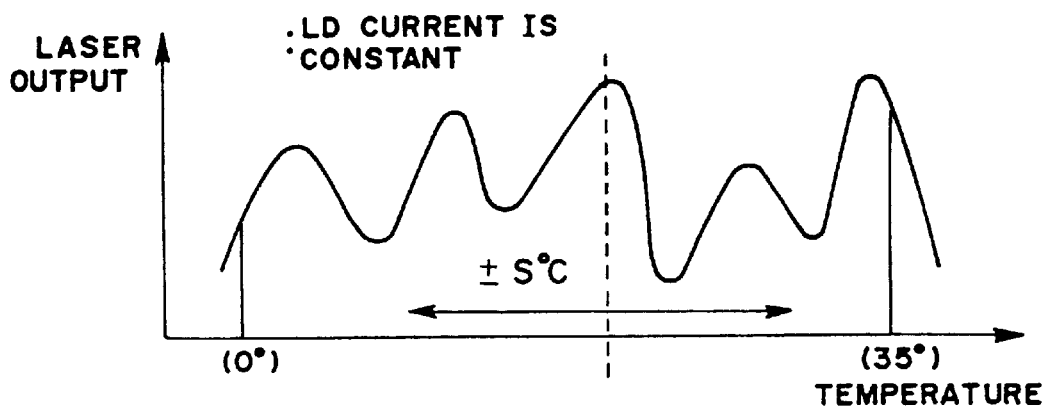
FIG. 13 is a graph showing the dependence of the output of the laser beam emitting apparatus on the temperature of a nonlinear optical medium when current supplied to the pumping laser diode is kept constant.

FIG. 13 is a graph showing the dependence of the output of the laser beam emitting apparatus on the temperature of the nonlinear optical medium 130 when current supplied to the pumping laser diode 110 is kept constant, in which the temperature of the nonlinear optical medium 130 is measured on the horizontal axis in the range of 0° C. to 35° C. and the output of the laser beam emitting apparatus 20000 is measured on the vertical axis. There is not any regular relation, such as a linear relation, between the output of the laser beam emitting apparatus 20000 and the temperature of the nonlinear optical medium 130, and a curve indicating the variation of the output of the laser beam emitting apparatus 20000 has a plurality of peaks.

Figure 14:
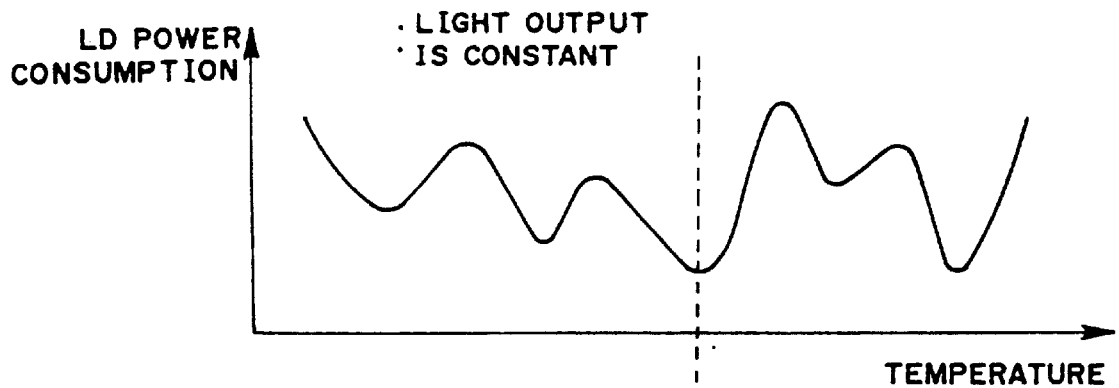
FIG. 14 is a graph showing the variation of the power consumption of the pumping laser diode with the temperature of the nonlinear optical medium when the output of the laser beam emitting apparatus is kept constant.

FIG. 14 is a graph showing the variation of the power consumption of the pumping laser diode 110 with the temperature of the nonlinear optical medium 130 when the output of the laser beam emitting apparatus 20000 is kept constant, in which the temperature of the nonlinear optical medium 130 is measured on the horizontal axis and the power consumption of the pumping laser diode 110 is measured on the vertical axis. There is not any regular relation, such as a linear relation, between the power consumption of the pumping laser diode 110 and the temperature of the nonlinear optical medium 130, and a curve indicating the variation of the power consumption of the pumping laser diode has a plurality of peaks.

Figure 15:
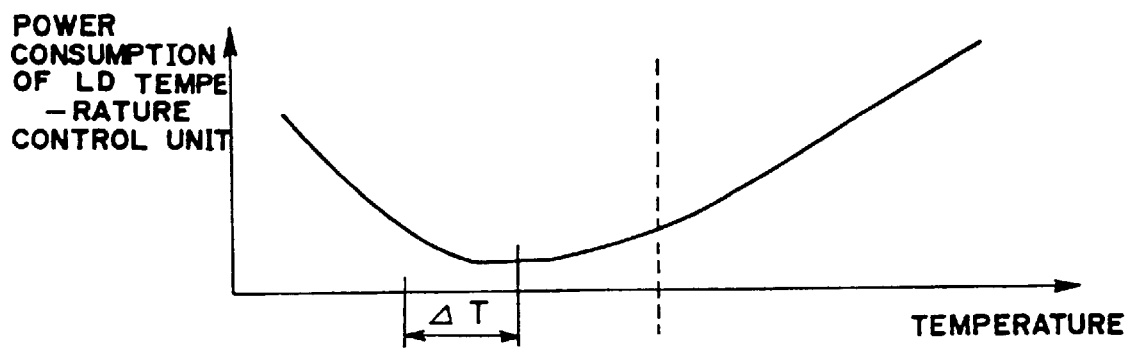
FIG. 15 is a graph showing the variation of the power consumption of a temperature control means employing a Peltier device driving unit with the temperature of the nonlinear optical medium.

FIG. 15 is a graph showing the variation of the power consumption of a temperature control means employing the Peltier device driving unit 300 with the temperature of the nonlinear optical medium 130, in which the temperature of the nonlinear optical medium 130 is measured on the horizontal axis and the power consumption of the temperature control means employing the Peltier device driving unit 300 is measured on the vertical axis. The power consumption curve of the temperature control means employing the Peltier device driving unit 300 has a minimum at a specific temperature. The power consumption increases from the minimum either when the temperature increases beyond the specific temperature or when the same decreases below the specific temperature. In FIG. 15, the ambient temperature is a°C., and the temperature of the nonlinear optical medium 130 is raised by ΔT° C. by the heat generated by the pumping laser diode 110. If the ambient temperature changes, the curve shown in FIG. 15 is horizontally translated.

Figure 16:
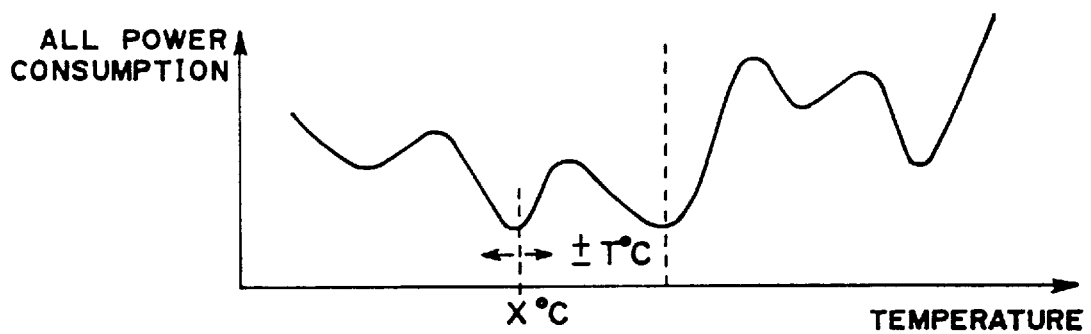
FIG. 16 is a graph showing the dependence of the sum of the power consumption of the pumping laser diode and that of the Peltier device driving unit consumed for temperature control on the temperature of the nonlinear optical medium.

FIG. 16 is a graph showing the dependence of the sum of the power consumption shown in FIG. 14 of the pumping laser diode 110 and that shown in FIG. 15 of the temperature control means employing the Peltier device driving unit 300 on the temperature of the nonlinear optical medium 130. It is known from FIG. 16 that a temperature at which the power consumption of the pumping laser diode 110 is a minimum does not necessarily coincide with a temperature at which the sum of the power consumption of the pumping laser diode 110 and that of the temperature control means employing the Peltier device driving unit 300 is a minimum. It is desirable to operate the laser beam emitting apparatus 20000 with the nonlinear optical medium 1300 kept at a temperature where the sum of the power consumption of the pumping laser diode 110 and that of the temperature control means employing the Peltier device driving unit 300 is a minimum.

Figure 17:
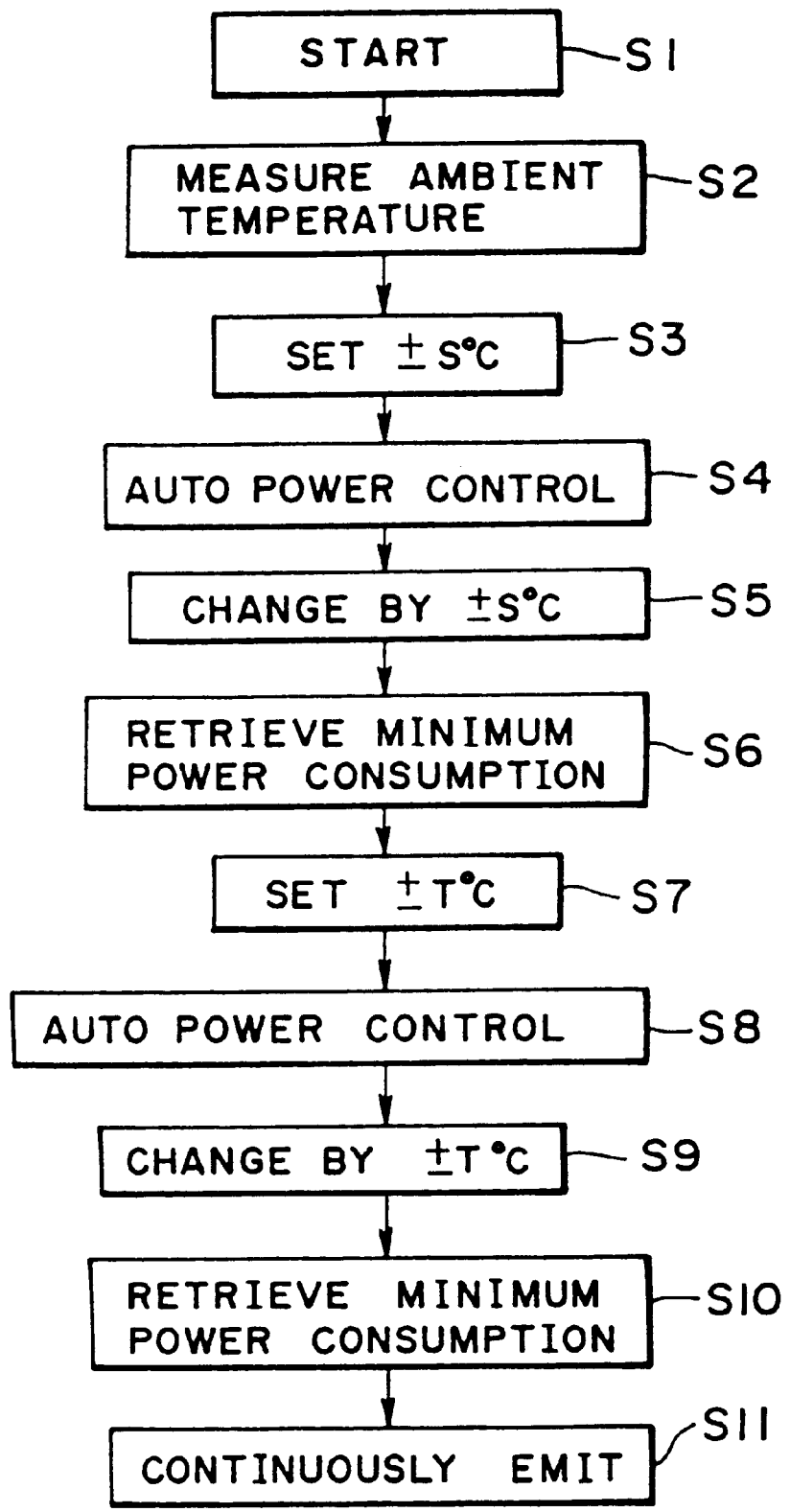
FIG. 17 is a flow chart of a control program to be executed by the laser beam emitting apparatus in this embodiment.

The operation of the laser beam emitting apparatus 20000 in this embodiment will be described hereinafter with reference to a flow chart shown in FIG. 17.

In step S1, the laser beam emitting apparatus 20000 is connected to the power supply to start the operation. The LD power supply 200 supplies power to the LD pulse driving unit 111, and the LD pulse driving unit 111 drives the pumping laser diode 110 to make the pumping laser diode 110 pump the laser crystal 120, and then the optical resonator of the laser beam emitting apparatus 20000 emits a green laser beam.

In step S2, the controller 800 receives ambient temperature data from the ambient temperature detector 700.

In step S3, the controller 800 sets a temperature change ±S° C., i.e., S° C. by which the temperature of the nonlinear optical medium 130 is to be increased or to be decreased, on the basis of the measured ambient temperature, taking into consideration a temperature rise ΔT of the nonlinear optical medium 130 heated by the heat generated by the pumping laser diode 110. In this embodiment, ±S° C. is ±7° C. If the ambient temperature is 16° C. and ΔT is 4° C., the temperature of the nonlinear optical medium 130 is controlled to a temperature of 13° C. to 27° C. in the range of 20° C.±7° C. by heating or cooling.

In step S4, the laser beam emitting apparatus 20000 is driven in an automatic power control mode. The controller 800 controls the LD power supply 200 on the basis of the detection signal provided by the external light intensity detecting unit 600 to make the LD pulse driving unit 111 drive the pumping laser diode 110 so that the laser beam emitting apparatus 20000 emits a green laser beam of a fixed intensity.

In step S5, while the condition for emitting the green laser beam of a fixed intensity is maintained, the Peltier device driving unit 300 drives the Peltier device 150 so that the temperature variation of the nonlinear optical medium 130 is limited to ±S° C. The controller 800 measures the power consumption of the pumping laser diode 110 and that of the Peltier device 150 from signals given thereto by the LD power supply 200 and the Peltier device driving unit 300, and determines the relation between the temperature of the nonlinear optical medium 130, and the power consumptions of the pumping laser diode 110 and the Peltier device 150.

Suppose that the power consumption of the laser head 100 is $W_1$ and that of the temperature control means employing the Peltier device driving unit 300 is $W_2$.

In step S6 conditions for reducing the total power consumption $W=W_1+W_2$ of the laser beam emitting apparatus 20000 to a minimum are determined. The controller 800 determines a temperature X° C. for the nonlinear optical medium 130 at which the total power consumption W is a minimum.

In step S7, a new temperature range X° C.±T° C., i.e., a range in which the temperature of the nonlinear optical medium 130 is to be increased or decreased, is determined. In this embodiment, ±T° C. is ±2° C. If X° C. is 19° C., the temperature of the nonlinear optical medium 130 is regulated in the range of 19° C.±2° C., i.e., in the range of 17° C. to 21° C. by heating or cooling.

In step S8, the laser beam emitting apparatus 20000 is operated continuously in the automatic power control mode, and the controller maintains the green laser beam of a fixed intensity and controls the Peltier device driving unit 300 to maintain the nonlinear optical medium 130 at temperatures in the range of X° C.±T° C. in step S9. The controller 800 receives signals indicating the power consumption of the pumping laser diode 110 and the power consumption of the Peltier device 150 from the LD power supply 200 and the Peltier device driving unit 300, respectively. Thus, the controller 800 determines the relation between the temperature of the nonlinear optical medium 130, and the respective power consumptions of the pumping laser diode 110 and the Peltier device 150 on the basis of the measured power consumptions of the pumping laser diode 110 and the Peltier device 150.

In step S10, conditions for operating the laser beam emitting apparatus 20000 at a minimum power consumption are determined. The controller 800 calculates a temperature Y° C. for the nonlinear optical medium 130 at which the total power consumption $W=W_1+W_2$ is a minimum. The temperature T° C. of the nonlinear optical medium 130 at which the total power consumption is a minimum can be determined even if the temperature at which the power consumption of the laser beam emitting apparatus 20000 is a minimum varies with time by repeatedly calculating the temperature Y° C.

In step S11, the temperature Y° C. is determined repeatedly, and the Peltier device driving unit 300 drives the Peltier device 150 so as to adjust the temperature of the nonlinear optical medium 130 to the temperature Y° C. to maintain the power consumption of the laser beam emitting apparatus 20000 at the minimum power consumption.

The temperature ranges ±S° C. and ±T° C. are optional. Since the range of temperature retrieval is narrowed gradually, the time necessary for retrieving the temperature can be reduced to a minimum. Rough measurement is performed at a high speed for the temperature range ±S° C., and then minute retrieval is performed at a low speed for the temperature range ±T° C. It is to be noted that quick, precise measurement of temperature in a wide temperature range cannot be achieved because temperature distribution on the nonlinear optical medium 130 is not uniform. The operation may be carried out in a plurality of steps instead of the two steps for the temperature ranges ±S° C. and and ±T° C.

A method of emitting the green laser beam by the laser beam emitting apparatus 20000 of the present invention will be described hereinafter.

Figure 18:
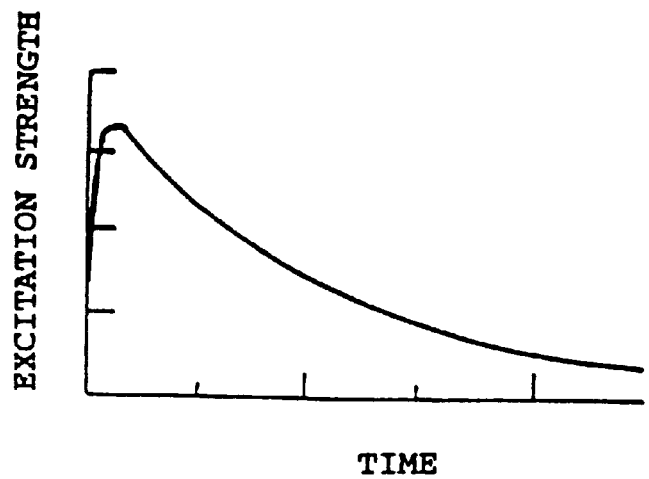
FIG. 18(*a*) is a graph of assistance in explaining gain switching, showing the variation of the intensity of excitation with time.
Figure 18:
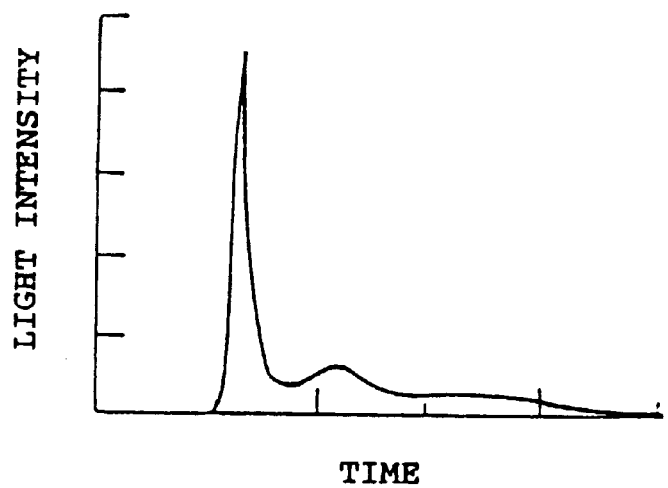
Figure 18:
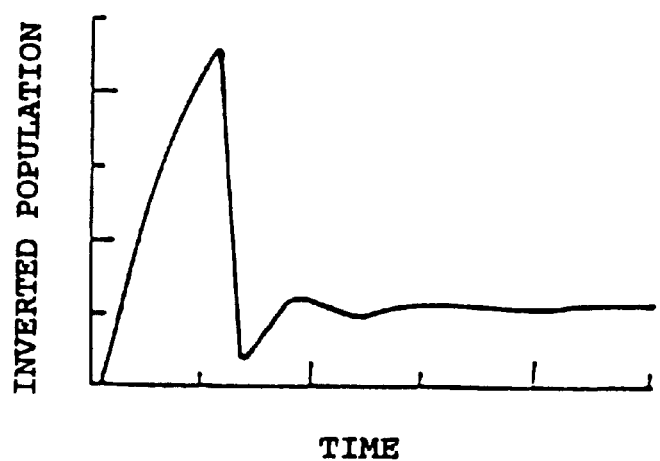

The laser resonator included in the laser head 100 will be described. FIGS. 18(a), 18(b) and 18(c) are typical views of assistance in explaining gain switching, showing the variation of the intensity of excitation with time, the variation of the intensity of light with time, and the variation of population inversion with time. It is known from FIGS. 18(a), 18(b) and 18(c) that the intensity of the green laser beam reaches a maximum after a fixed pumping time.

Figure 19:
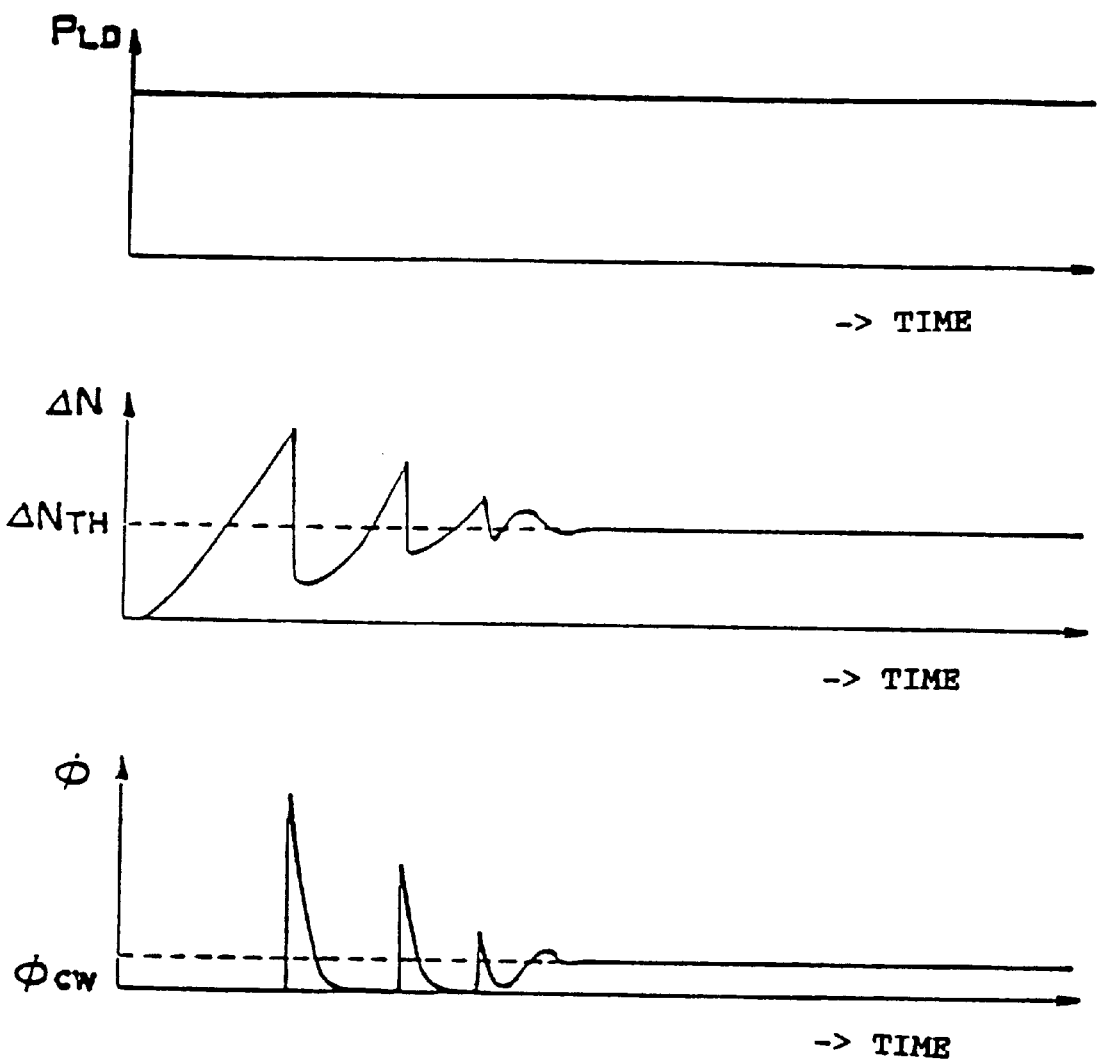
FIG. 19 is graphs showing the relation between time and population inversion.

FIG. 19 shows the relation between population inversion and the intensity of light. If a driving power of a continuous wave is supplied to the pumping laser diode 110, the intensity increases to a maximum at the first pulse, and then the intensity decreases to a fixed intensity. Therefore, light can most efficiently be emitted if only the first pulse is used.

Figure 20A:
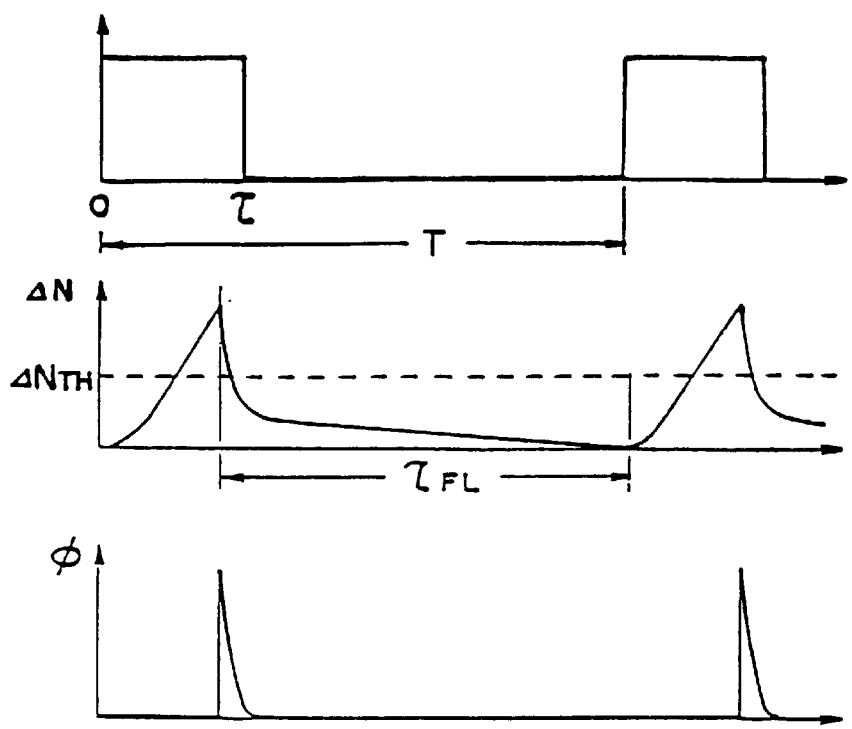
FIG. 20(*a*) is graphs showing a condition when the period T of pulse driving power supplied to the pumping laser diode meets a condition expressed by $\tau_{FL} < T-\tau$.
Figure 20B:
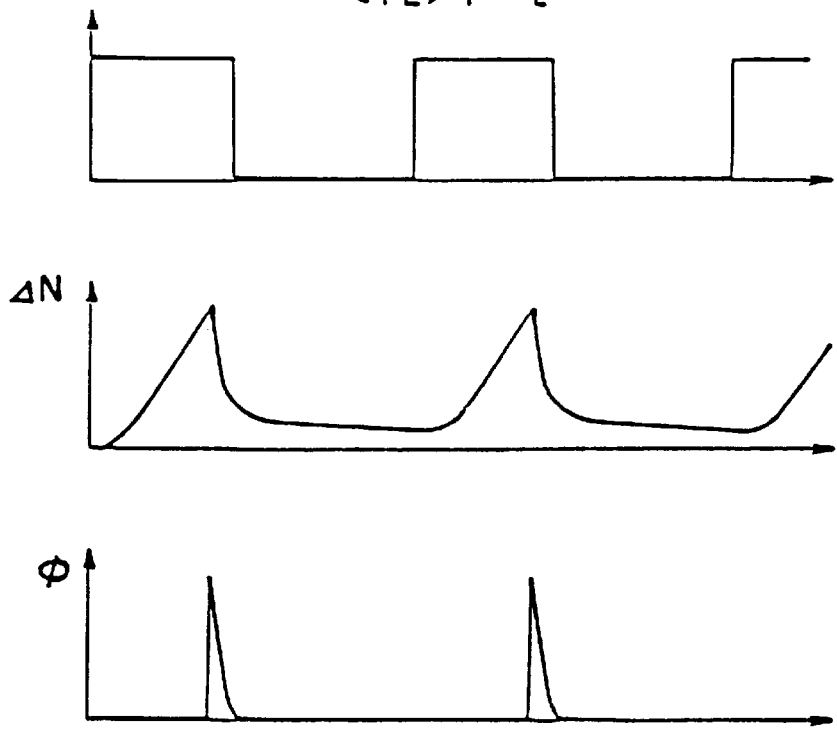

A condition when a pulse driving power is supplied to the pumping laser diode 110 will be described with reference to FIGS. 20(a) and 20(b). FIG. 20(a) is graphs showing a condition when the period T of the pulse driving power meets a condition expressed by $\tau_{FL}<T-\tau$, where $\tau_{FL}$ is fluorescence lifetime and τ is pulse width, and FIG. 20(b) is graphs showing a condition when the period T meets a condition expressed by $\tau_{FL}>T-\tau$. It is known from FIG. 20(b) that a new state of population inversion is added to a residual state of population inversion and light of a maximum intensity can effectively and continuously be emitted if the next pulse of driving power is supplied to the pumping laser diode 110 within the fluorescence lifetime $\tau_{FL}$.

The relation between the output of the pumping laser diode 110 and the output when the nonlinear optical medium 130 is inserted will be described with reference to FIGS. 21(a) to 21(d).

Figure 21:
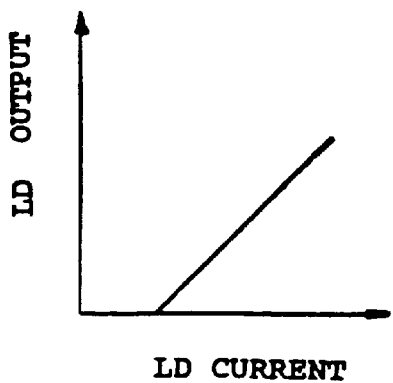
FIG. 21(*a*) is a graph showing the relation between the output of the pumping laser diode and the current supplied to the pumping laser diode.

FIG. 21(a) is a graph showing the relation between the output of the pumping laser diode 110 and the current supplied to the pumping laser diode 110. The output of the pumping laser diode 110 varies linearly with the current supplied to the pumping laser diode 110 in a current range beyond an offset current.

Figure 21B:
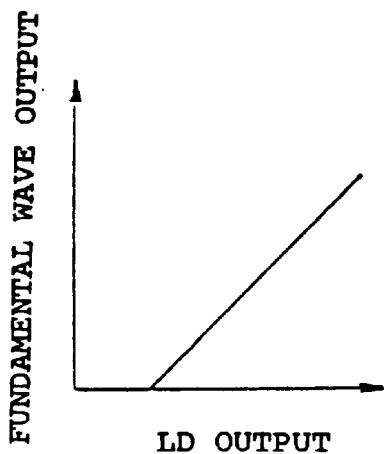
FIG. 21(d) is a graph showing the relation between the output of a second harmonic wave and current supplied to the pumping laser diode.

FIG. 21(b) is a graph showing the relation between the output of a fundamental wave in an optical resonator and the output of the pumping laser diode 110. The output of the fundamental wave varies linearly with the output of the pumping laser diode 110 in an output range beyond an offset output.

Figure 21C:
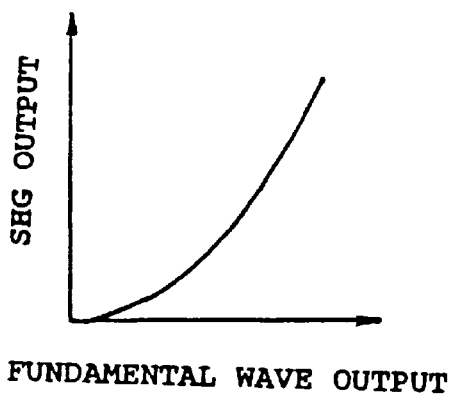
Figure 21:
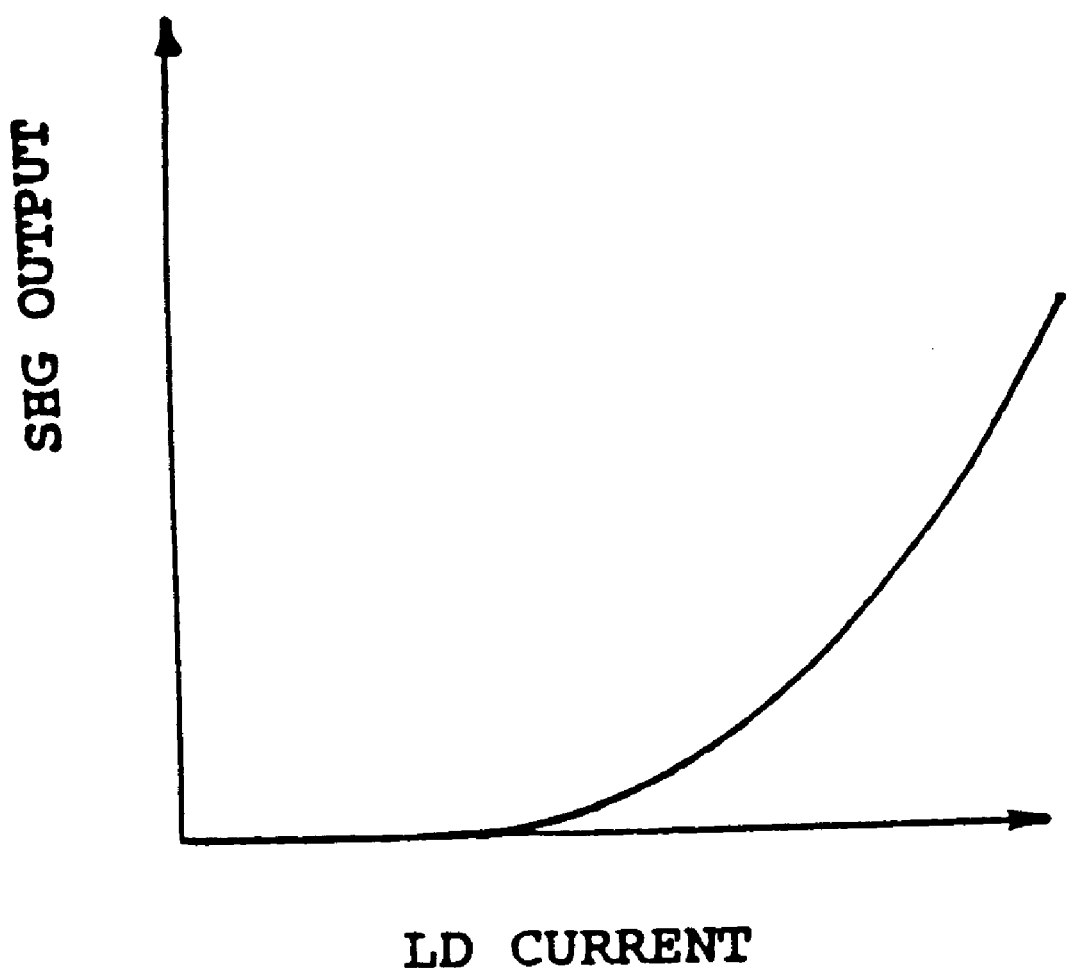

FIG. 21(c) is a graph showing the relation between the output of a fundamental wave in the optical resonator and the output of a second harmonic wave when a nonlinear optical medium is inserted in the optical resonator. The output of the second harmonic wave is proportional to the square of the output of the fundamental wave in the optical resonator. Therefore, as shown in FIG. 21(d), the output of the second harmonic wave is proportional to the square of the current supplied to the pumping laser diode 110.

Figure 22:
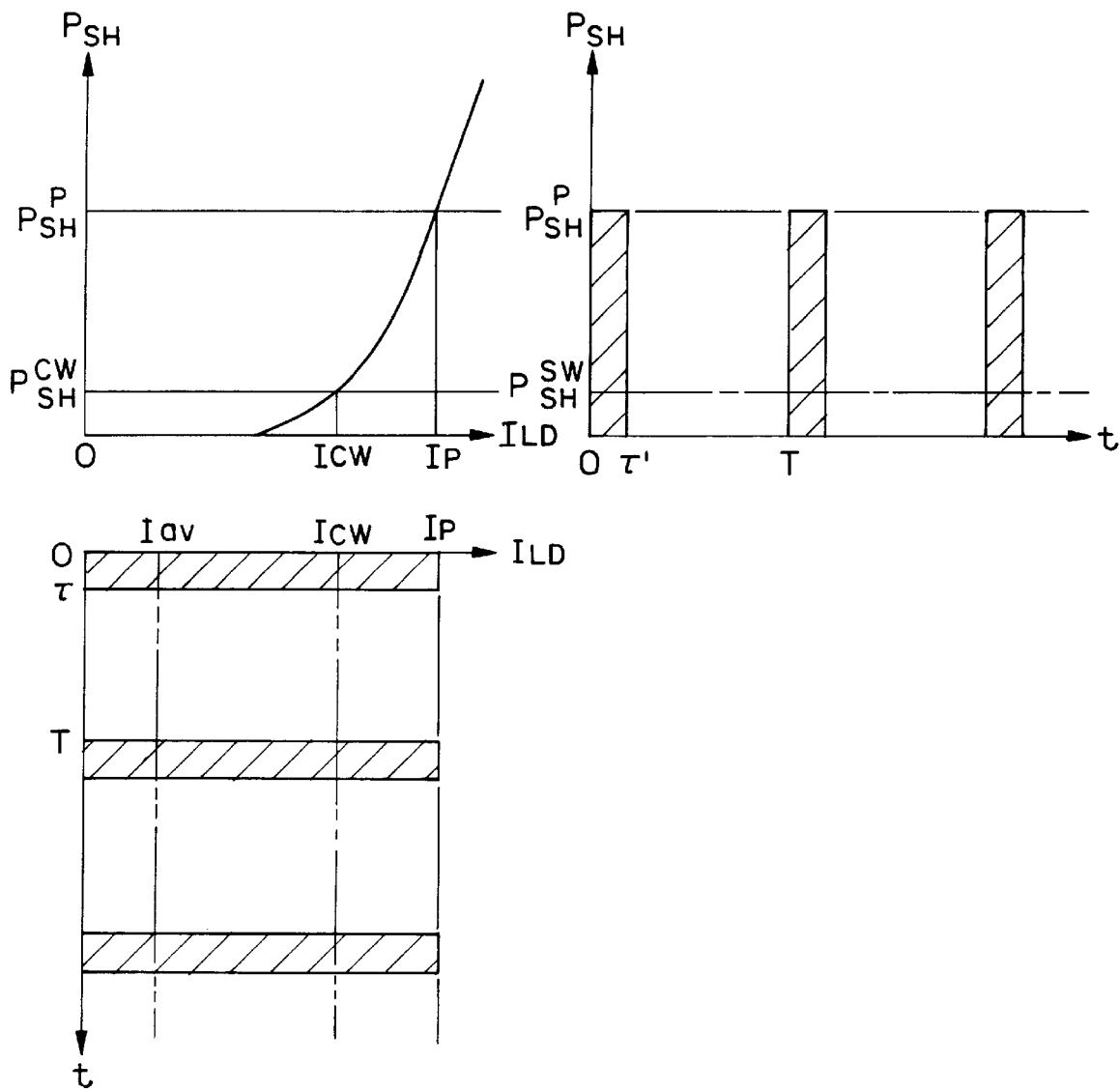
FIG. 22 is graphs comparatively showing a condition where the laser beam emitting apparatus is continuously driven and a condition where the laser beam emitting apparatus is driven by a driving pulse signal.

Accordingly, the laser beam can be emitted at a high efficiency as shown in FIG. 22 when the nonlinear optical medium 130 is inserted in the optical resonator, and the LD pulse driving unit 111 applies the next driving pulse to the pumping laser diode 110, a semiconductor laser, in the fluorescence lifetime $\tau_{FL}$ to drive the pumping laser diode 110. As shown in FIG. 22, a pulse laser beam having a pulse width $\tau'$ and a peak value $P^P_{SH}$ is generated if the pumping laser diode 110 is driven by a driving current having a pulse width $\tau$, a peak value $I_P$ and a pulse period T. If the pumping laser diode 110 is driven by a direct current $I_{cw}$ so that continuous output $P^{cw}_{SH}$ is equal to mean pulse output $P^{av}_{SH}$, the output of the second harmonic wave is proportional to the square of the power consumption of the pumping laser diode 110. Therefore, only a laser beam of a continuous output $P^{cw}_{SH}$ lower than the peak value $P^P_{SH}$ is generated. Since the pumping laser diode 110 operates intermittently if the same is driven by a pulse current, mean pulse current $I_{av}$ is smaller than the continuous current $I_{cw}$. This reduces power consumption necessary for generating a laser beam of the same intensity, reduces the heat generated by the pumping laser diode 110, and reduces the current to be supplied to the Peltier device 150.

In view of those fact, when driving the pumping laser diode 110 by a pulse current, the timing pulse generator 240 included in the LD power supply 200 operates so as to interrupt the driving current upon the increase of the first pulse to a maximum, and to supply the next pulse current within the fluorescence lifetime $\tau_{FL}$.

The laser beam emitting apparatus in this embodiment is capable of a flickering operation, which will be described with reference to FIG. 8. When stopping the emission of the green laser beam, the controller 800 opens the analog switch 210, the logic circuit 218 prohibits the output signal of the comparator 214, the timing signal of the timing pulse generator 240 is prohibited, and the current loop of the pumping laser diode 110 is set in a hold state. Since the pumping laser diode 110 is not energized, electrical energy stored in the capacitor 224 of the switching regulator 220 is not consumed. At the same time, the output signal of the comparator 214 is prohibited, charging of the capacitor 224 of the switching regulator 220 is stopped, and a state the same as a state in which the pumping laser diode 110 is energized can be maintained while the pumping laser diode 110 is not energized. In this state, the controller 800 interrupts the feedback of the green laser beam. When the pumping laser diode 110 is energized, the controller 800 closes the analog switch 216, the logic circuit 218 withdraws the prohibition against the output signal of the comparator 214, the current loop of the pumping laser diode 110 resumes a constant current loop, and the controller 800 resumes the feedback of the green laser beam.

Since the stable feedback control of the green laser beam is possible regardless of the duration of de-energization of the pumping laser diode 110 even if the pumping laser diode 110 is flickered by the holding function of the PWM 210, the stable emission of the green laser beam is possible.

Figure 23:
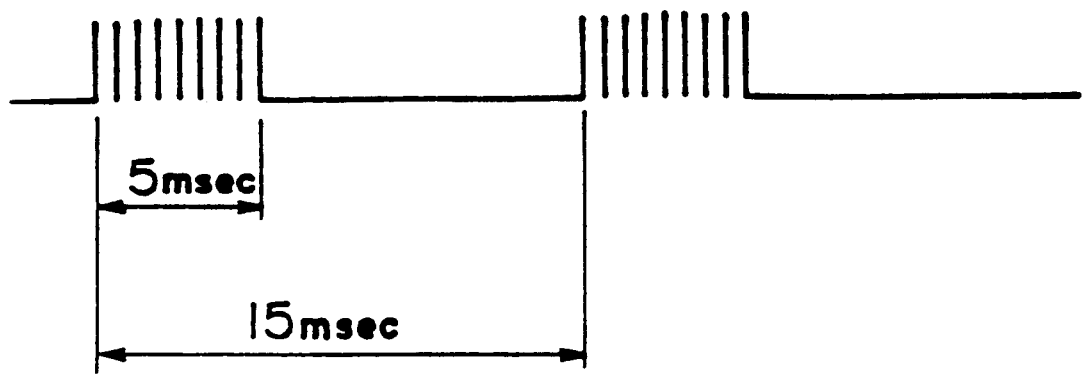
FIG. 23 is a diagram showing a mode of operation of the laser beam emitting apparatus for flickering light emission.

A flickering operation of the laser beam emitting apparatus 20000 will be described with reference to FIG. 23 showing the flicker of pulse light of several hundreds kilohertz at a frequency of about 60 Hz and at a duty factor of about 30%. The pulse light thus flickered is perceived to be continuous light of a brightness equal to 30% of that of the nonflickering pulse light.

Since the intensity of the green laser beam, i.e., the second harmonic wave, is proportional to the square of the current supplied to the pumping laser diode 110, the adjustment of the intensity of the pulse light requires a current smaller than that required when the peak value of the current for driving the pumping laser diode 110, and hence power consumption is reduced.

The flickering frequency need not be limited to about 60 Hz; the pulse light may be flickered at any frequency which will give the next pulse of the pulse light before a visual sensation disappears. The brightness of the pulse light can be varied by varying the duty factor of flickering.

Figure 24:
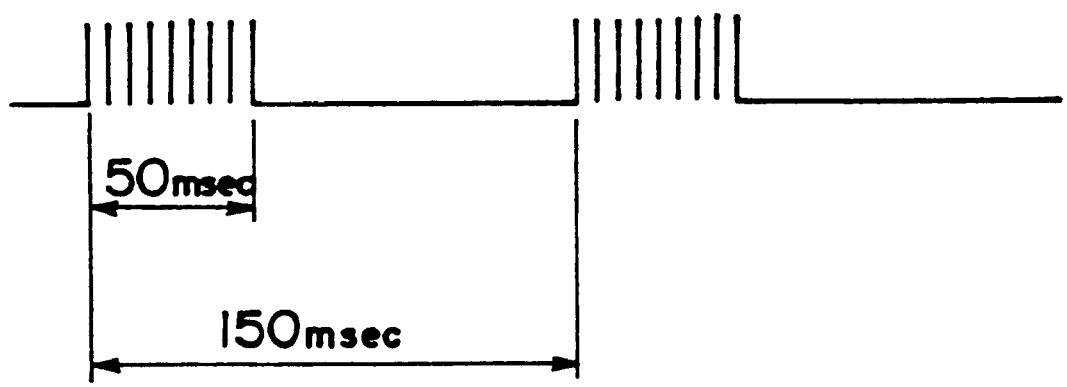
FIG. 24 is a diagram of assistance in explaining a flickering mode using Bartley effect.

FIG. 24 shows another mode of flicker of pulse light of several hundreds kilohertz at a frequency of 7 Hz and at a duty factor of 30%.

It is generally known that the visual sensation of light by the human eye has a peak at time 50 to 120 ms after the reception of a light stimulus. A light stimulus can effectively be given to the human eye by setting the duration of the light pulse to a time substantially equal to a time in which the sensation of brightness reaches a maximum after a visual stimulus has been given to the eye, and setting the duration of de-energization of the pumping laser diode 110 to a time substantially equal to a time in which the eye restores its maximum sensitivity after the reception of light. Experiments showed that the frequency of the flicker of the pulse light which makes the pulse light most recognizable is in the range of 6 to 15 Hz. A phenomenon that the peak brightness of flickering light of about 10 Hz is stressed is called Bartley effect or Brucke-Bartley effect. It is known that maximum Bartley effect is exercised when the ratio between energizing time and de-energizing time is 1:1, which means that the visual sensitivity reaches a maxim during the energizing time of 50 ms, and the maximum visual sensitivity is restored in the de-energizing time of 50 ms. When the de-energizing time is 50 ms or above, the eye can be stimulated effectively by the next light pulse.

FIG. 24 shows a mode of flicker and a de-energizing time determined to flicker the pulse light in the foregoing flickering mode. The power consumption of the pumping laser diode 110 when the pumping laser diode 110 is operated in the foregoing flickering mode is about 30% of the power consumption of the same when the same is operated continuously to emit a continuous pulse green laser beam of several hundreds kilohertz, and the pulse green laser beam thus controlled is able to give a visual stimulus about twice a visual stimulus which can be given to the eye by a continuous pulse green laser beam of several hundreds kilohertz.

Figure 25:
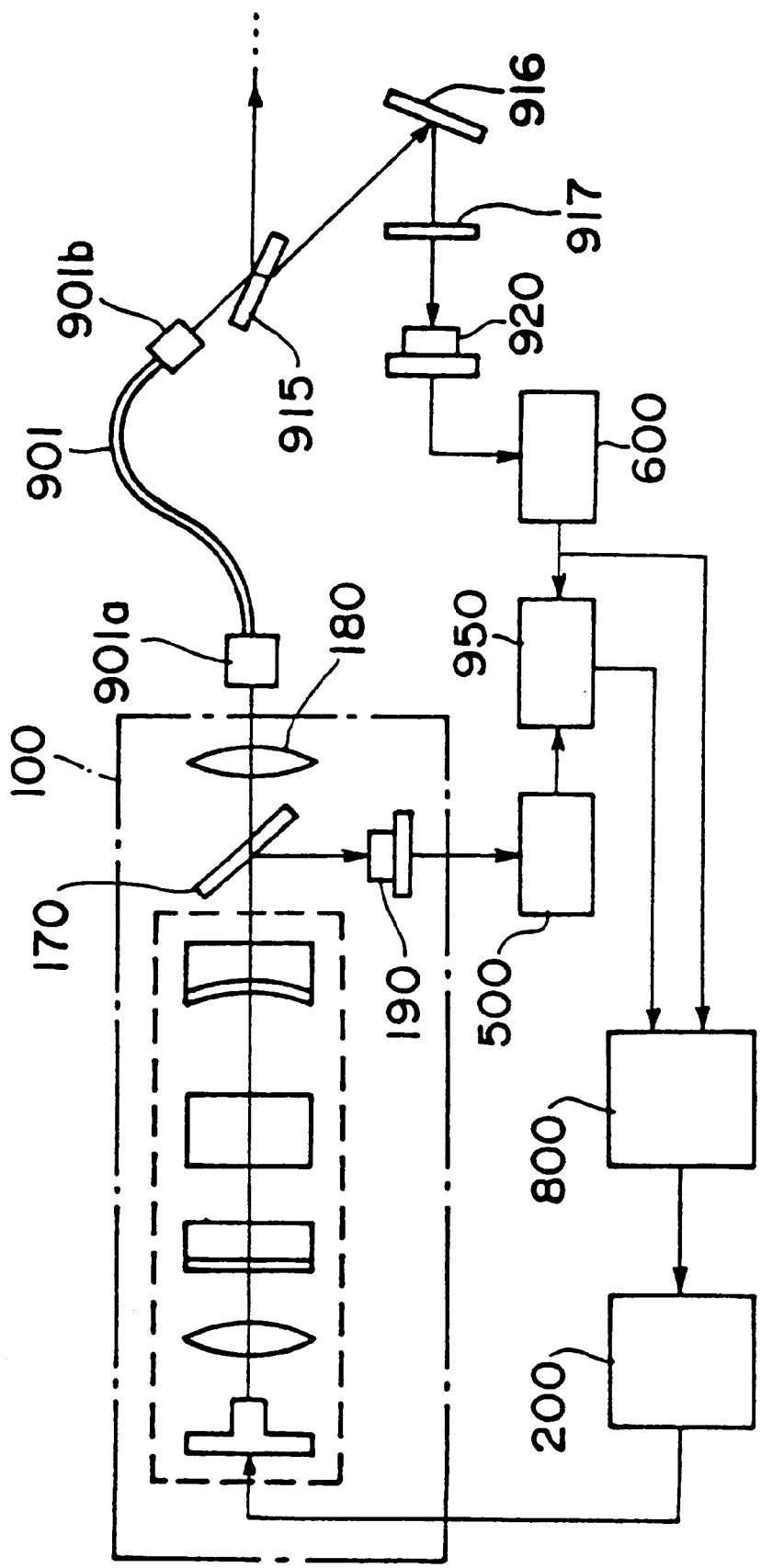
FIG. 25 is a block diagram of assistance in explaining a modification of a method of detecting the intensity of light in a laser head and at an end of a fiber.

An arrangement for detecting the intensity of light in the laser head 100 and detecting the intensity of light at the exit end of the fiber 900, employed in a laser beam emitting apparatus in a second embodiment according to the present invention will be described with reference to FIG. 25. In the laser beam emitting apparatus 20000 in the first embodiment, the intensity of the green laser beam generated in the laser head 100 is detected by the internal light intensity detecting unit 500, the first half mirror 170 and the first photodiode 190, and the intensity of the green laser beam at the exit end of the fiber 900 is detected by the external light intensity detecting unit 600, the second half mirror 910 and the second photodiode 920. The laser beam emitting apparatus in the second embodiment employs a polarizing mirror 915 instead of the second half mirror 910 of the laser beam emitting apparatus 20000 in the first embodiment, and a constant polarization fiber 901 instead of the fiber 900 of the laser beam emitting apparatus 20000 in the first embodiment. When polarized light of a predetermined direction of polarization falls on the entrance end of the fiber 900, i.e., an ordinary fiber, nonpolarized light appears at the exit end of the fiber 900. The constant polarization fiber 901 is able to transmit light, preserving the direction of polarization.

The polarizing mirror 915 is disposed near the exit end 901*b* of the constant polarization fiber 901, a mirror 916 is disposed below the polarizing mirror 915, and a polarizing plate 917 and a second photodiode 920 are arranged in that order below the mirror 916. Part of the green laser beam emitted from the exit end 901*b* of the constant polarization fiber 901 is transmitted through the polarizing mirror 915, is reflected by the mirror 916, travels through the polarizing plate 917 and fall on the second photodiode 920. Thus, the direction of polarization of the linearly polarized green laser beam emitted by a laser head 100 is preserved by the constant polarization fiber 910, and the green laser beam is emitted toward the polarizing mirror 915. The polarizing mirror 915 reflects most part of the green laser beam and transmits several percent of the green laser beam. The green laser beam emitted from the exit end 901*b* of the constant polarization fiber 901 is S-polarized light containing some P-polarized light component. The polarizing mirror 915 transmits several percent of the S-polarized light and the P-polarized light. The polarizing plate 917 transmits only the S-polarized light and hence only the S-polarized light falls on the second photodiode 920. The second photodiode 920 and the external light intensity detecting unit 600 determines the intensity of the green laser beam at the exit end 901*b* of the fiber 901.

In the second embodiment, a comparator 950 is connected to the internal light intensity detecting unit 500 and the external light intensity detecting unit 600. The comparator 950 compares the respective detection signals of the internal light intensity detecting unit 500 and the external light intensity detecting unit 600, and sends a control signal to a controller 800 when the difference between the respective detection signals of the internal light intensity detecting unit 500 and the external light intensity detecting unit 600 is outside a predetermined range. If the difference between the respective detection signals of the internal light intensity detecting unit 500 and the external light intensity detecting unit 600 is within the predetermined range, the detection signal of the external light intensity detecting unit 600 is given to the controller 800. The controller 800 controls the operation of a LD power supply 200 on the basis of the detection signal of the external light intensity detecting unit 600 to control the laser beam emission of a pumping laser diode 110. If the difference between the respective detection signals of the internal light intensity detecting unit 500 and the external light intensity detecting unit 600 is outside the predetermined range, it is considered that the intensity of the green laser beam is reduced or enhanced due to the variation of fiber coupling efficiency caused by the dislocation of a condenser lens 180 or the entrance end 901*a* of the constant polarization fiber 901, the breakage of the constant polarization fiber 901 or some other cause. In such a case, the controller 800 may stop the operation of the LD power supply 200 or may provide an indication of abnormal conditions.

Figure 26:
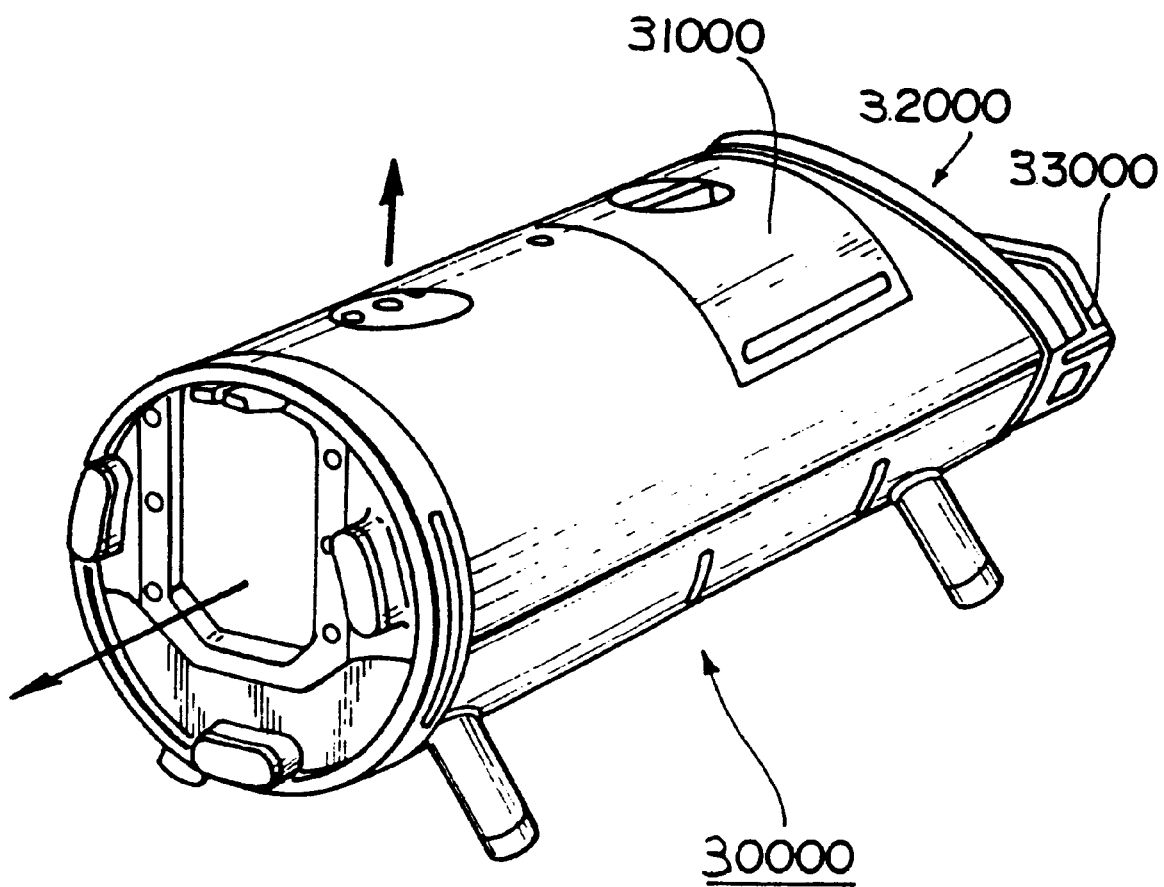
FIG. 26 is a perspective view of a pipe laser apparatus incorporating the laser beam emitting apparatus of the present invention.
Figure 27:
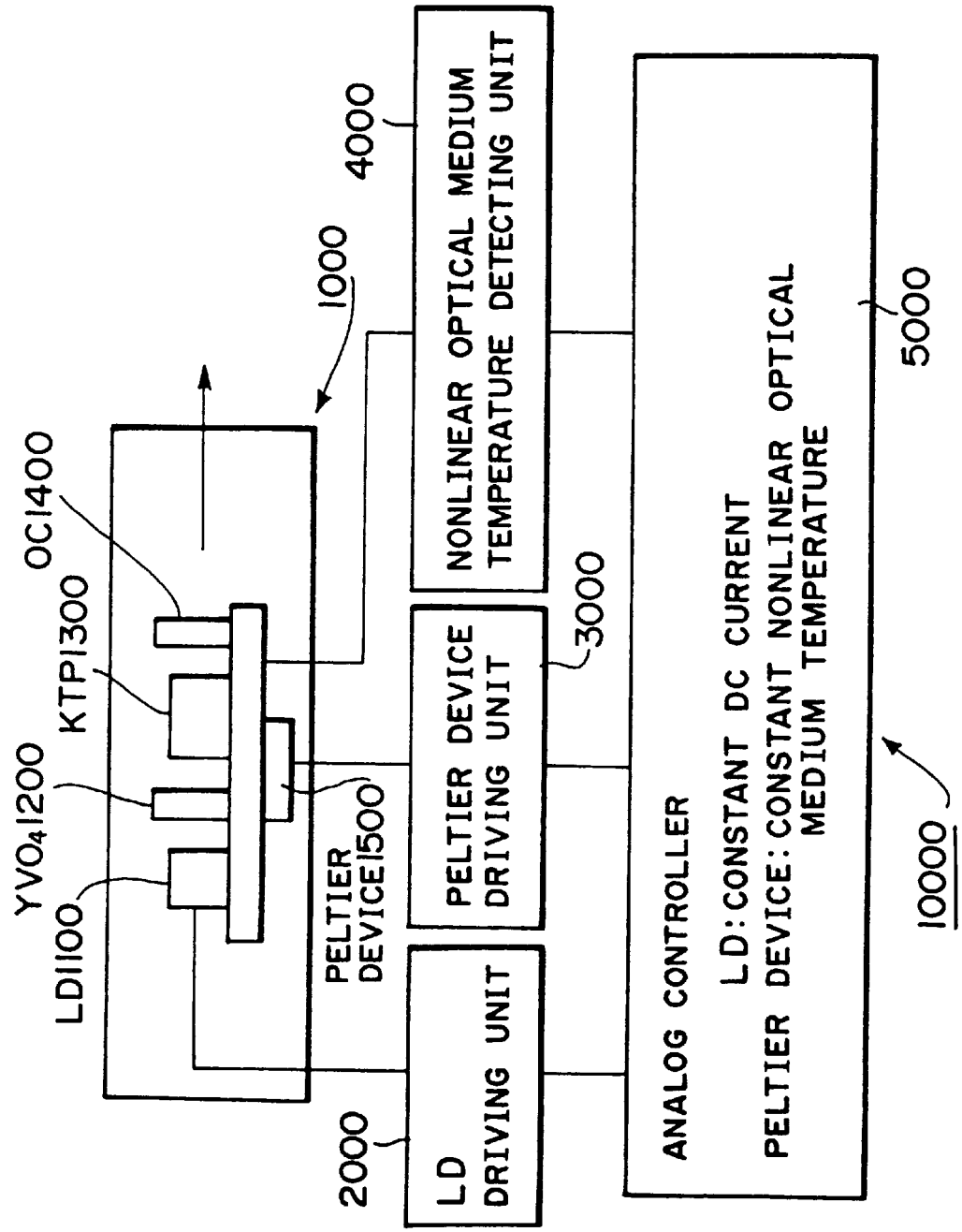
FIG. 27 is a block diagram of a conventional laser beam emitting apparatus.
Figure 28:
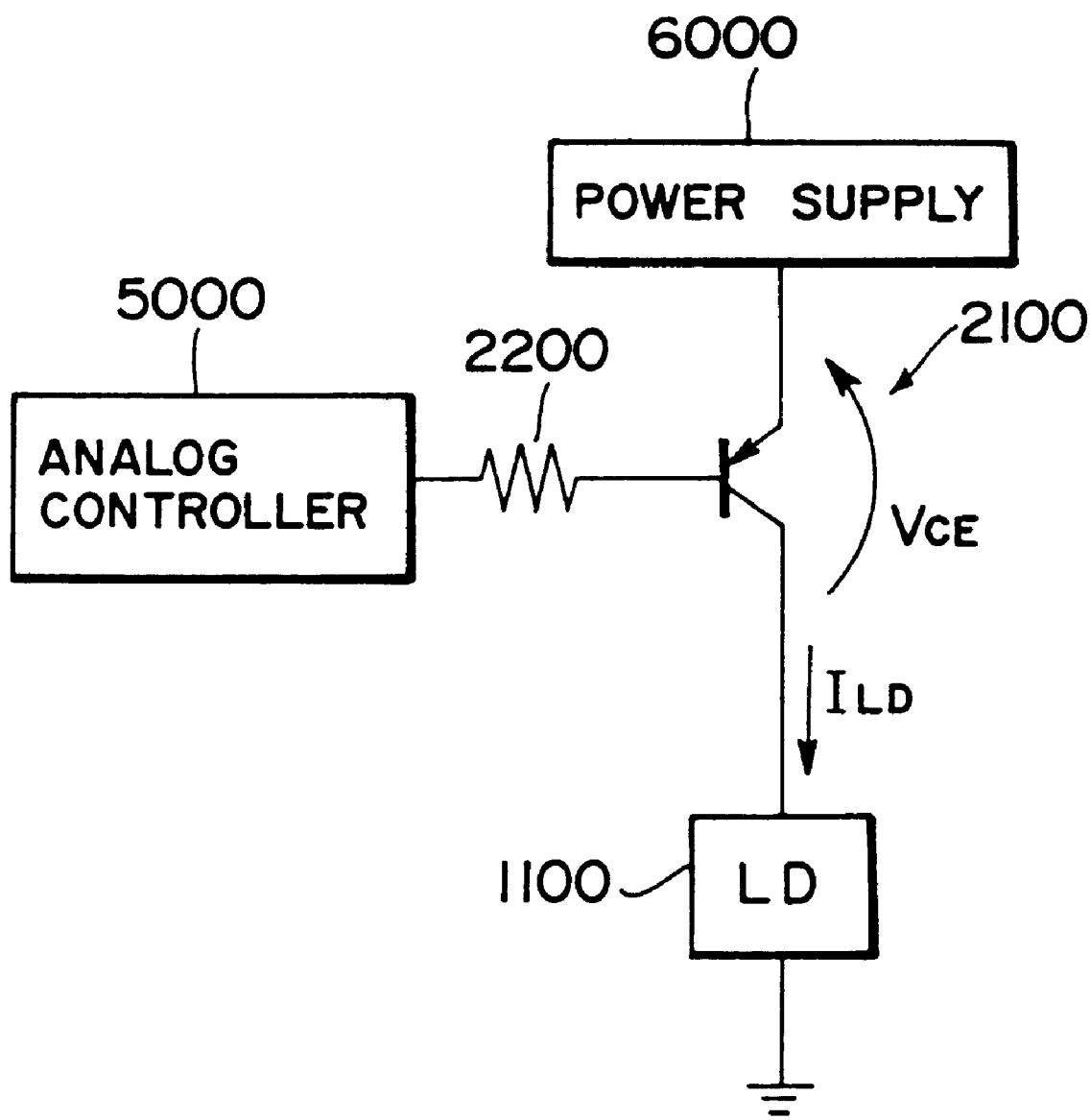
FIG. 28 is a block diagram of a laser diode driving unit included in the laser beam emitting apparatus of FIG. 27.
Figure 29:
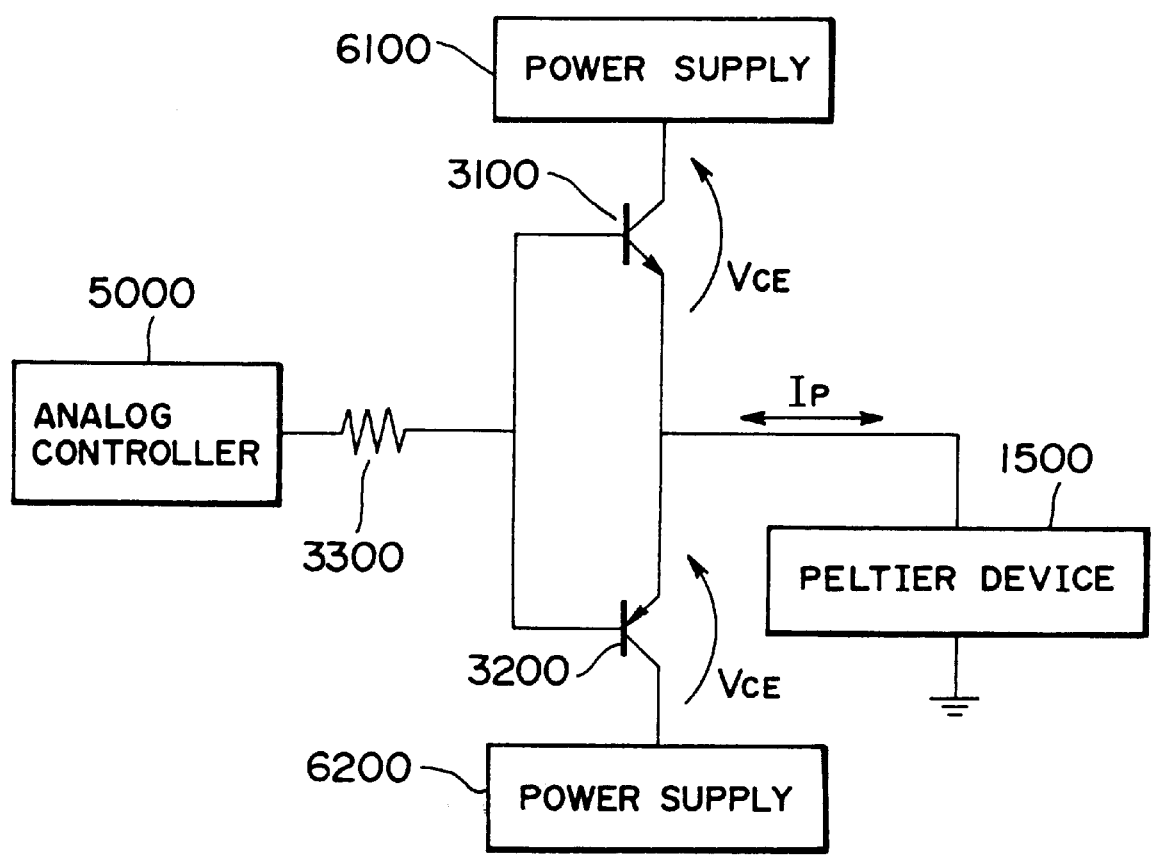
FIG. 29 is a block diagram of a Peltier device driving unit included in the laser beam emitting apparatus of FIG. 27.

The laser beam emitting apparatus 20000 of the present invention is applicable to a pipe laser apparatus 30000 shown in FIG. 26. The pipe laser apparatus 30000 is internally provided with the laser beam emitting apparatus 20000 and is capable of emitting guide beams in horizontal and vertical directions. The pipe laser apparatus 30000 has a battery box 31000 containing a battery, i.e., a power supply, a control panel 32000, and a handle 33000.

The Peltier device driving unit employed in the present invention drives the Peltier device included in the laser beam emitting apparatus provided with the optical resonator having at least the laser crystal and the output mirror. The switching regulator generates a voltage corresponding to the duty factor of the PWM, the current detector detects the current supplied to the Peltier device, the H-bridge changes the flowing direction of the current supplied to the Peltier device. Accordingly, the laser system is able to operate at a low power consumption and can be driven by power supplied from a battery.

In the laser diode driving means employed in the present invention, the switching regulator generates a voltage corresponding to the duty factor of the PWM, and the current detector detects the current supplied to the pumping laser diode. Therefore, the current control circuit carries out a switching operation using a saturation region or a cutoff region. Accordingly, the laser beam emitting apparatus is able to operate at a low power consumption.

The H-bridge employed in the present invention comprises the p-channel FETs and the n-channel FETs connected in parallel with the p-channel FETs. Therefore, the laser beam emitting apparatus is able to operate at a low power consumption, and can be fabricated at a relatively low cost because only a single power supply is necessary.

Since the LD pulse drive unit is sealed in the laser head employed in the present invention, the inductance is relatively small and the laser head is resistant to noise.

In the laser beam emitting apparatus of the present invention, the nonlinear optical medium inserted in the optical resonator generates a second harmonic wave, the pumping laser diode pumps the optical resonator, the laser beam is transmitted by the fiber, the intensity of the laser beam is detected by the external light intensity detecting means disposed at the end of the fiber, and the controller may control the light emitting operation of the pumping laser diode on the basis of the detection signal of the external light intensity detecting means.

In the laser beam emitting apparatus of the present invention, the optical resonator is internally provided with the internal light intensity detecting means, the controller is able to control the light emitting operation of the pumping laser diode on the basis of the detection signals of the external light intensity detecting means and the internal light intensity detecting means. Therefore, the dislocation of the condenser lens and the fiber, the breakage of the fiber, and the malfunction of the external light intensity detecting means can be detected.

What is claimed is:

1. A laser beam emitting apparatus comprising:
   a Peltier device;
   a driving unit for driving the Peltier device, said Peltier device driving unit comprising a pulse width modulator (PWM); a switching regulator which generates a voltage corresponding to the duty factor of the pulse width modulator (PWM); a current detector for detecting a current supplied to the Peltier device; and an H-bridge for changing the flowing direction of the current supplied to the Peltier device.

2. A laser beam emitting apparatus according to claim 1, wherein said H-bridge comprises p-channel FETs and n-channel FETs, said p-channel FETs being connected in parallel with said n-channel FETs.

3. A laser beam emitting apparatus according to claim 1, further comprising:
   a temperature detector for detecting the temperature, and
   a control unit for controlling the Peltier device on the basis of said temperature detection.

4. A laser beam emitting apparatus according to claim 1, comprising:

an optical resonator having at least a laser crystal and an output mirror;

a nonlinear optical medium inserted in the optical resonator to generate a second harmonic wave;

a pumping laser diode for pumping said optical resonator;

a fiber for transmitting a part of the laser beam;

a light intensity detecting means external to the optical resonator for detecting the laser beam transmitted by said fiber and supplying a detection signal; and a controller for controlling a laser emitting operation of the pumping laser diode on the basis of the detection signal provided by said external light intensity detecting means.

5. A laser beam emitting apparatus according to claim 1, comprising:

an optical resonator having at least a laser crystal and an output mirror;

a nonlinear optical medium inserted in the optical resonator to generate a second harmonic wave;

a pumping laser diode for pumping said optical resonator;

a fiber for transmitting a part of the laser beam;

a light intensity detecting means external to the optical resonator for detecting the laser beam transmitted by said fiber and supplying a detection signal;

an internal light intensity detecting means included in the optical resonator for supplying an internal detection signal; and a controller for controlling a laser emitting operation of the pumping laser diode on the basis of the detection signals provided by said external light intensity detecting means and said internal light intensity detecting means.

* * * * *